US012641834B2

(12) United States Patent
Hsin et al.

(10) Patent No.: US 12,641,834 B2
(45) Date of Patent: May 26, 2026

(54) SEMICONDUCTOR DEVICE CAPABLE OF RELEASING PROCESS CHARGE, AND METHOD FOR MANUFACTURING THE SAME

(71) Applicant: TAIWAN SEMICONDUCTOR MANUFACTURING COMPANY, LTD., Hsinchu (TW)

(72) Inventors: Bo-Huan Hsin, Hsinchu (TW); Ying-Han Chiou, Hsinchu (TW); Ming-Yen Tsai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 381 days.

(21) Appl. No.: 18/328,096

(22) Filed: Jun. 2, 2023

(65) Prior Publication Data

US 2024/0405127 A1     Dec. 5, 2024

(51) Int. Cl.
    *H10D 30/67*     (2025.01)
    *H10D 30/01*     (2025.01)
    *H10D 30/62*     (2025.01)

(52) U.S. Cl.
    CPC ......... *H10D 30/6757* (2025.01); *H10D 30/01* (2025.01); *H10D 30/62* (2025.01); *H10D 30/6735* (2025.01); *H10D 30/6219* (2025.01)

(58) Field of Classification Search
    CPC .... H10D 30/6757; H10D 30/62; H10D 30/01; H10D 30/6735; H10D 30/6219
    USPC ........................................................ 257/213
    See application file for complete search history.

(56) References Cited

U.S. PATENT DOCUMENTS

| | | | | |
|---|---|---|---|---|
| 9,035,316 B2 * | 5/2015 | Yamazaki | .............. | H10D 84/83 |
| | | | | 257/350 |
| 10,311,945 B2 * | 6/2019 | Masuoka | ............. | H10D 64/512 |
| 11,223,789 B2 * | 1/2022 | Kurokawa | ........... | H10F 39/199 |
| 2015/0349079 A1 * | 12/2015 | Masuoka | ............... | H10D 30/63 |
| | | | | 257/351 |
| 2020/0099881 A1 * | 3/2020 | Kurokawa | .......... | H10F 39/8053 |

\* cited by examiner

*Primary Examiner* — Jami Valentine Miller

(74) *Attorney, Agent, or Firm* — Birch, Stewart, Kolasch & Birch, LLP

(57) ABSTRACT

A semiconductor device includes a first transistor, a first via contact, a second transistor and a second via contact. The first transistor includes a channel and a gate electrode. The first via contact is disposed on the gate electrode of the first transistor, and corresponds in position to the channel of the first transistor. The second transistor includes a channel and a gate electrode. The second via contact is disposed on the gate electrode of the second transistor, and corresponds in position to the channel of the second transistor. A distance between the second via contact and the channel of the second transistor is smaller than a distance between the first via contact and the channel of the first transistor.

20 Claims, 30 Drawing Sheets

31 forming fin structures and STIs — 311 forming gate stacks — 312 forming gate spacers — 313 forming source/drain electrodes — 314 forming an ILD — 315 forming gate dielectrics and gate electrodes — 316

600

672

671b

671a

661

663

601b

601a

652

652

651

651

Z

X

Y

SEMICONDUCTOR DEVICE CAPABLE OF RELEASING PROCESS CHARGE, AND METHOD FOR MANUFACTURING THE SAME

BACKGROUND

Charges may be generated during fabrication of a semiconductor device. These charges have to be released, so as to prevent low yield of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is taken along any one of line A-A and line B-B of FIG. 5, FIGS. 7, 9, 11, 13, 15, 17 and 20 are similar to FIG. 5, FIGS. 8, 10, 12, 14 and 16 are similar to FIG. 6, FIGS. 18 and 21 are similar to FIG. 6 when taken along line B-B of FIG. 5, and FIGS. 19 and 22 are similar to FIG. 6 when taken along line A-A of FIG. 5.

DETAILED DESCRIPTION

Figure 1:
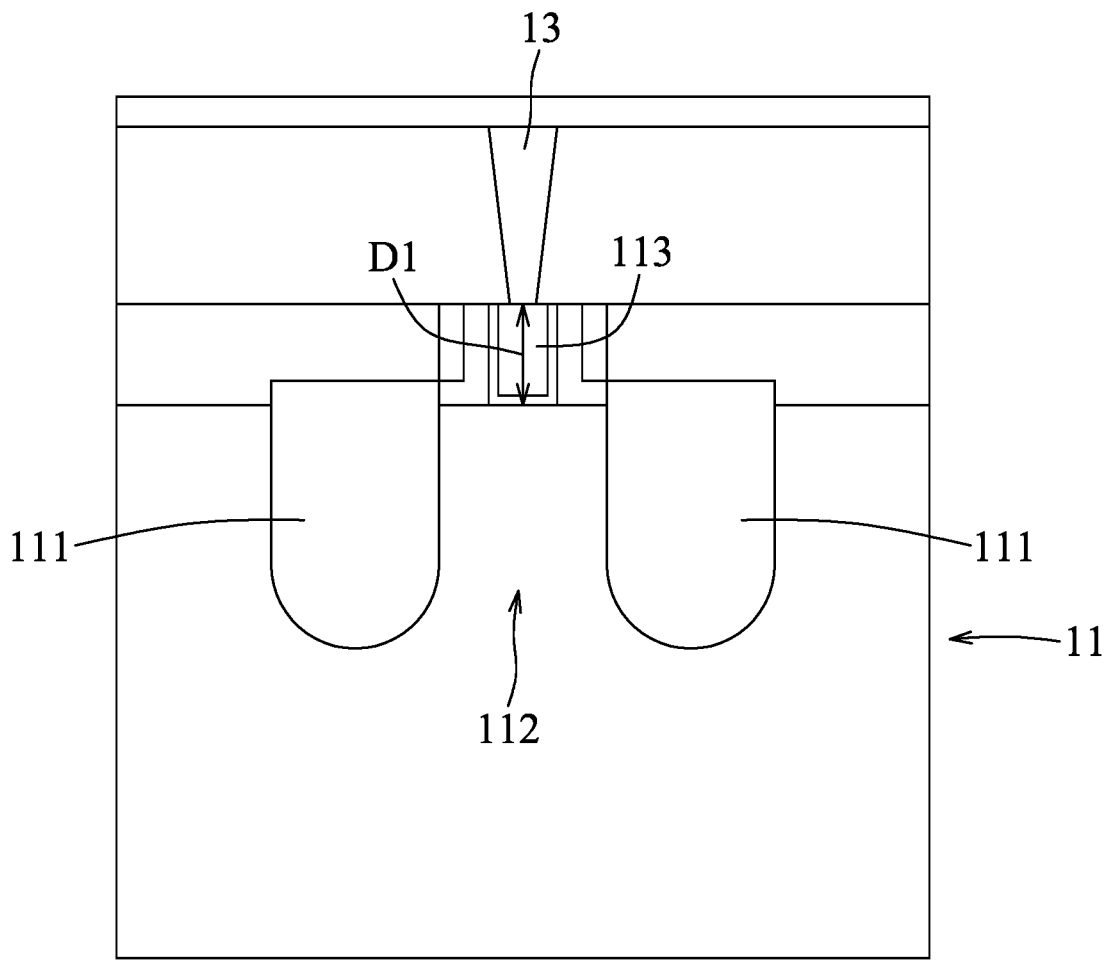
FIGS. 1 and 2 are schematic sectional views of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "downwardly." "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Figure 2:
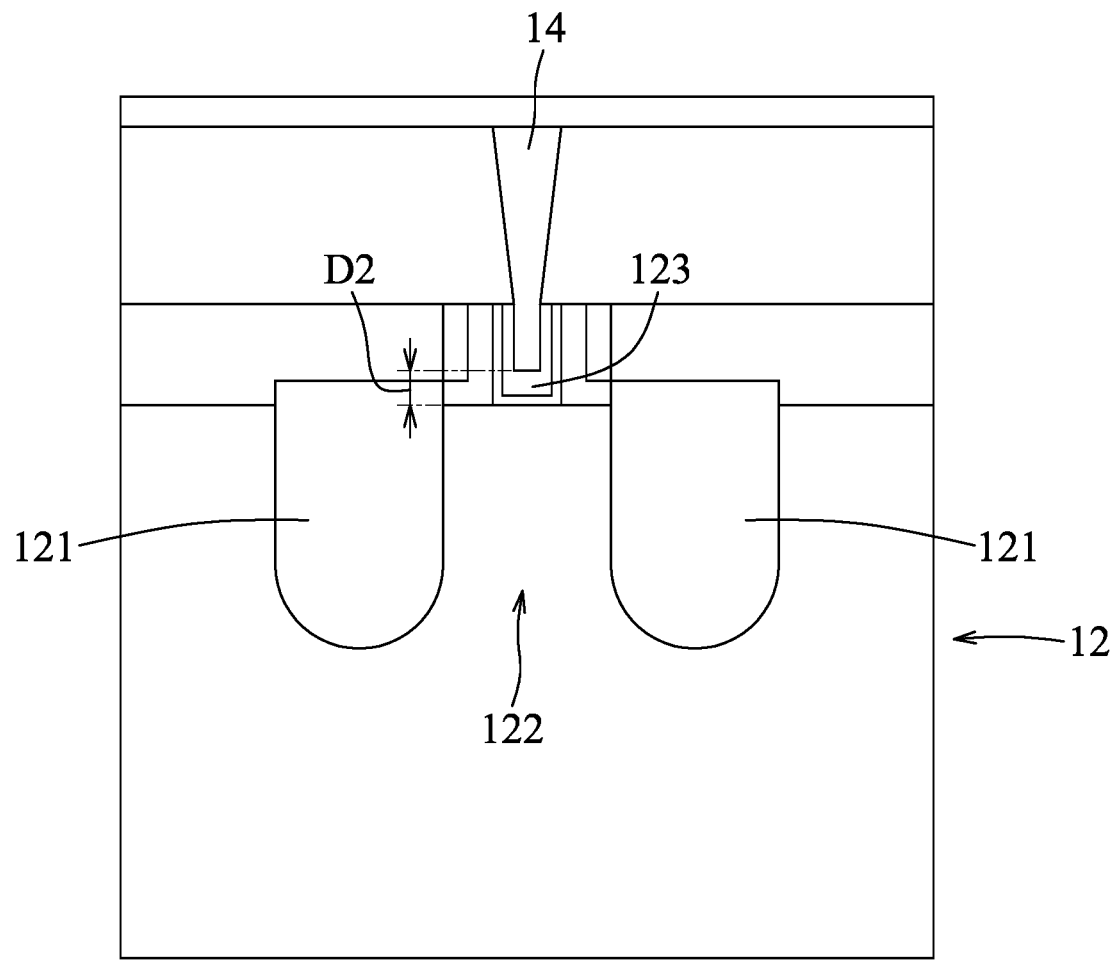

FIGS. 1 and 2 are schematic sectional views of a semiconductor device in accordance with some embodiments. The semiconductor device includes a first transistor 11, a second transistor 12, a first via contact 13 and a second via contact 14. Each of the first transistor 11 and the second transistor 12 includes two source/drain electrodes 111/121, a channel 112/122 and a gate electrode 113/123. With respect to each of the first transistor 11 and the second transistor 12, the channel 112/122 is disposed between and interconnects the source/drain electrodes 111/121, and the gate electrode 113/123 is disposed to control current flow in the channel 112/122. The first via contact 13 is disposed on the gate electrode 113 of the first transistor 11, and corresponds in position to the channel 112 of the first transistor 11. A bottom surface of the first via contact 13 is coplanar with a top surface of the gate electrode 113 of the first transistor 11 (i.e., a distance (D1) between the bottom surface of the first via contact 13 and a top surface of the channel 112 of the first transistor 11 is equal to a distance between the top surface of the gate electrode 113 of the first transistor 11 and the top surface of the channel 112 of the first transistor 11). The second via contact 14 is disposed on the gate electrode 123 of the second transistor 12, and corresponds in position to the channel 122 of the second transistor 12. A lower portion of the second via contact 14 is surrounded by the gate electrode 123 of the second transistor 12, so a bottom surface of the second via contact 14 is lower than a top surface of the gate electrode 123 of the second transistor 12 (i.e., a distance (D2) between the bottom surface of the second via contact 14 and a top surface of the channel 122 of the second transistor 12 is smaller than a distance between the top surface of the gate electrode 123 of the second transistor 12 and the top surface of the channel 122 of the second transistor 12). The distance between the top surface of the gate electrode 123 of the second transistor 12 and the top surface of the channel 122 of the second transistor 12 is equal to the distance between the top surface of the gate electrode 113 of the first transistor 11 and the top surface of the channel 112 of the first transistor 11, so the distance (D2) between the bottom surface of the second via contact 14 and the top surface of the channel 122 of the second transistor 12 is smaller than the distance (D1) between the bottom surface of the first via contact 13 and the top surface of the channel 112 of the first transistor 11 (i.e., D2<D1).

Figure 23:
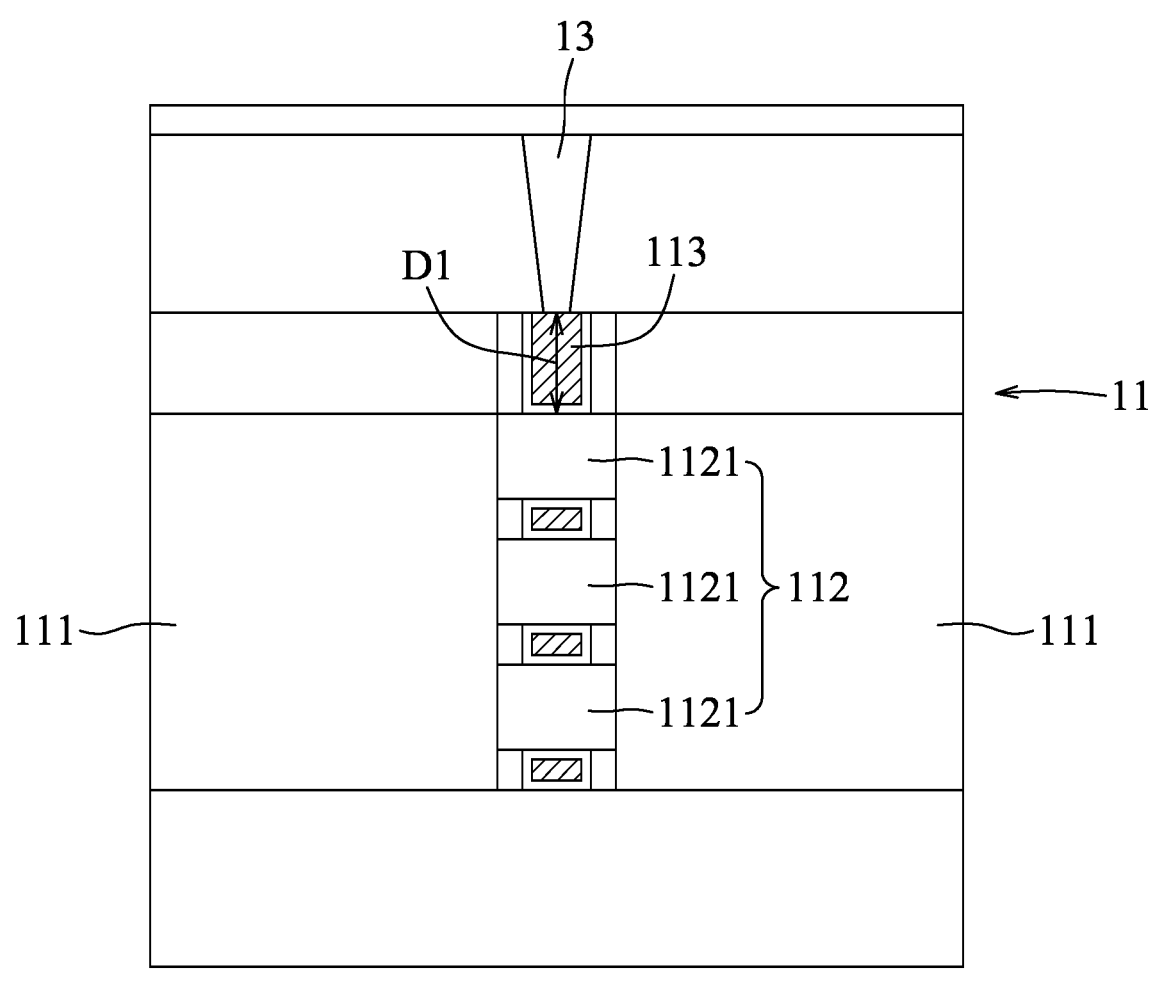
FIGS. 23 and 24 are schematic sectional views of a semiconductor device in accordance with some embodiments.
Figure 24:
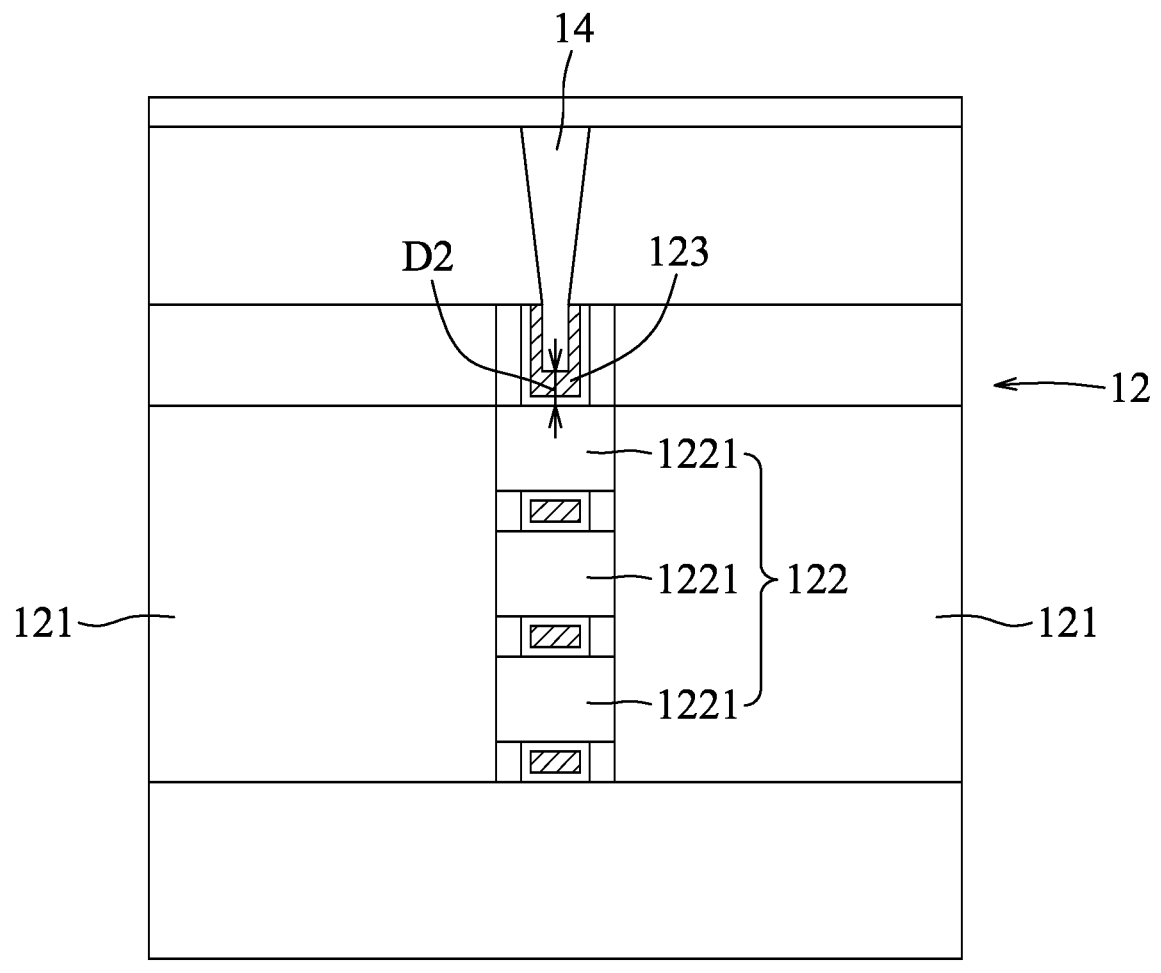

In some embodiments, each of the first transistor 11 and the second transistor 12 may be, for example, but not limited to, a fin field effect transistor (FinFET) as shown in FIGS. 1 and 2, a gate-all-around (GAA) FET as shown in FIGS. 23 and 24, or a planar FET. In some embodiments where each of the first transistor 11 and the second transistor 12 is a FinFET as shown in FIGS. 1 and 2, with respect to each of the first transistor 11 and the second transistor 12, the gate electrode 113/123 wraps top and lateral sides of the channel 112/122.

In some embodiments, since the distance (D2) between the bottom surface of the second via contact 14 and the top surface of the channel 122 of the second transistor 12 is smaller than the distance (D1) between the bottom surface of the first via contact 13 and the top surface of the channel 112 of the first transistor 11, charges that are generated during further processes performed on the semiconductor device can be released through the second via contact 14 and the second transistor 12, thereby preventing low yield of the semiconductor device.

In some embodiments, the distance (D2) between the bottom surface of the second via contact 14 and the top surface of the channel 122 of the second transistor 12 is smaller than half the distance (D1) between the bottom surface of the first via contact 13 and the top surface of the channel 112 of the first transistor 11 (i.e., D2<D1/2), so the semiconductor device can have significant charge releasing effect.

It should be noted that charge releasing may cause the second via contact 14 and the channel 112 of the second transistor 12 to be connected to each other, but the connection of the second via contact 14 and the channel 112 of the second transistor 12 would not affect operation of the semiconductor device.

Figure 3:
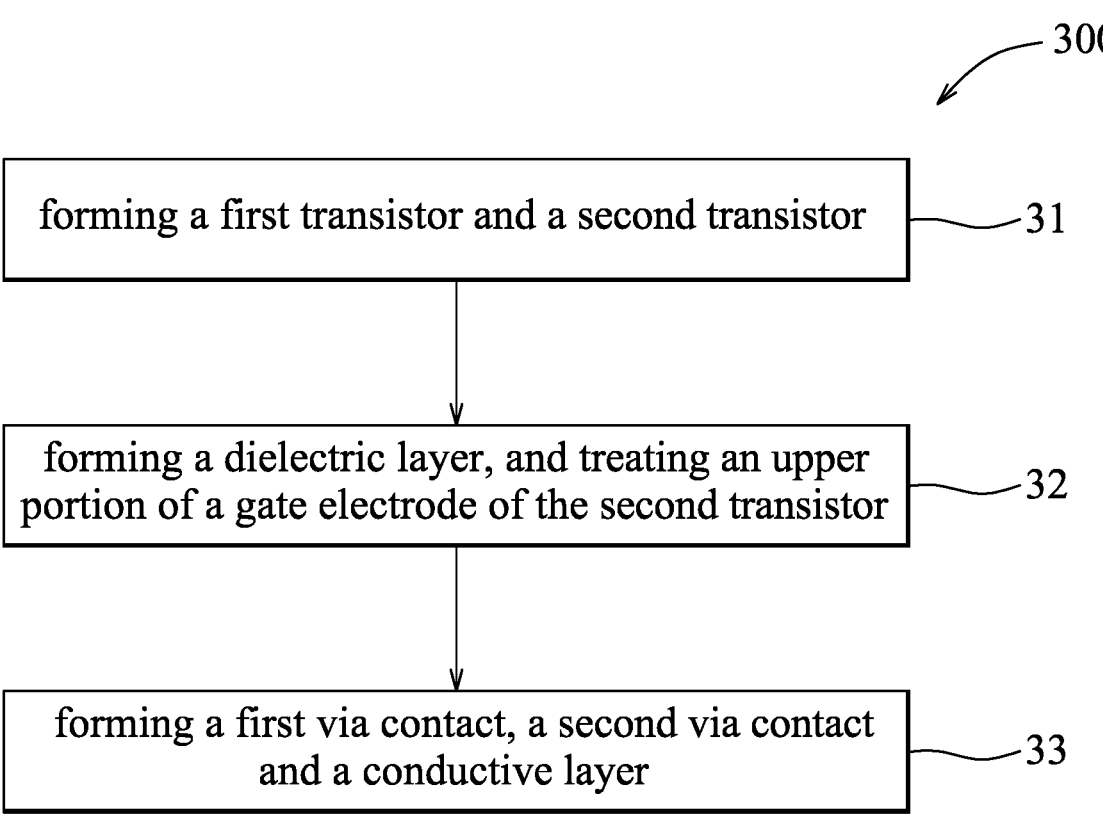
FIGS. 3 and 4 are flow charts illustrating a method for manufacturing a semiconductor device in accordance with some embodiments.
Figure 4:
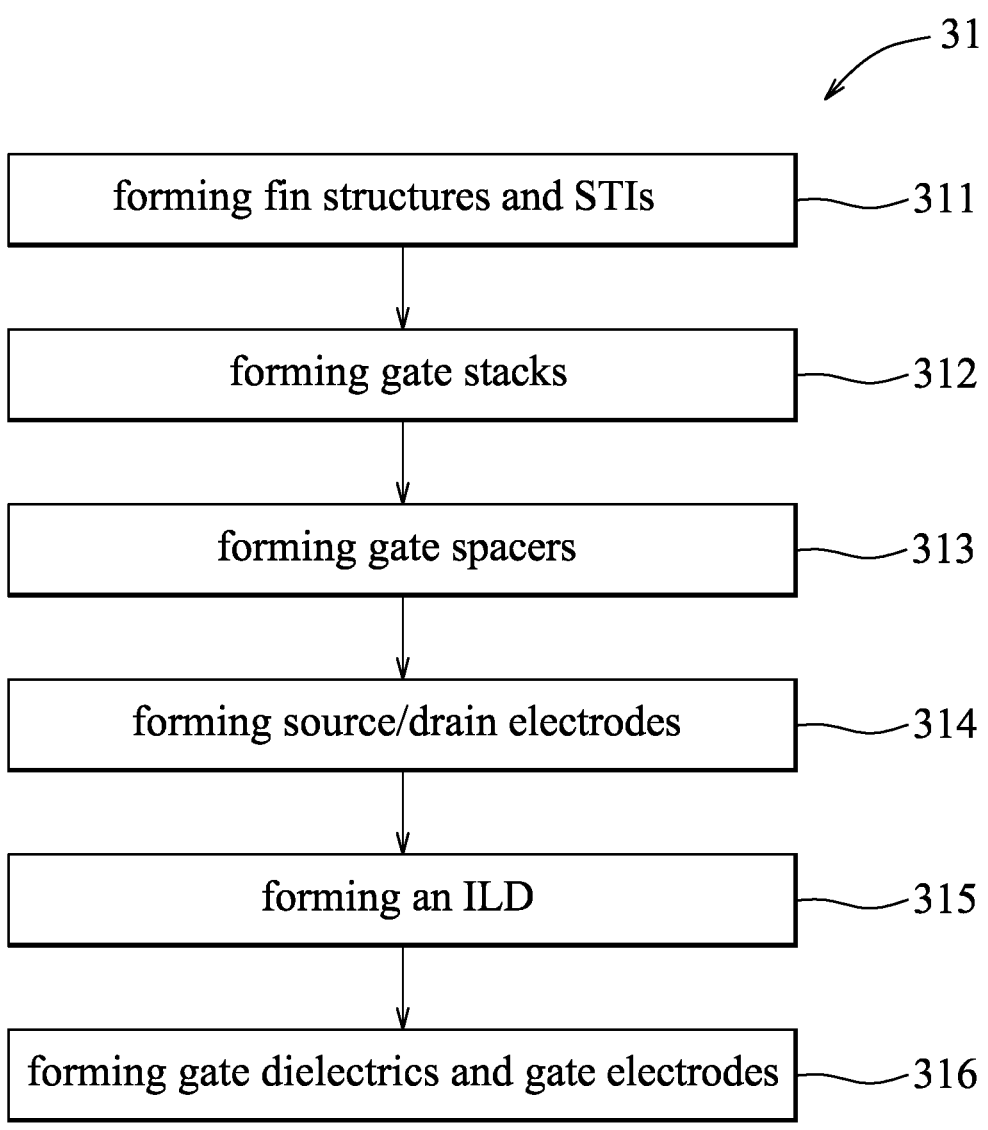

FIGS. 3 and 4 are flow charts illustrating a method 300 for manufacturing a semiconductor device in accordance with some embodiments. FIGS. 5 to 22 are schematic sectional views of semiconductor structures 600 during various stages of the method 300. The method 300 and the semiconductor structures 600 will be described below. Additional steps can be provided before, after or during the method 300, and some of the steps described herein may be replaced by other steps or be eliminated. Similarly, further additional features may be present in the semiconductor structures 600, and/or features present may be replaced or eliminated in additional embodiments.

Figure 15:
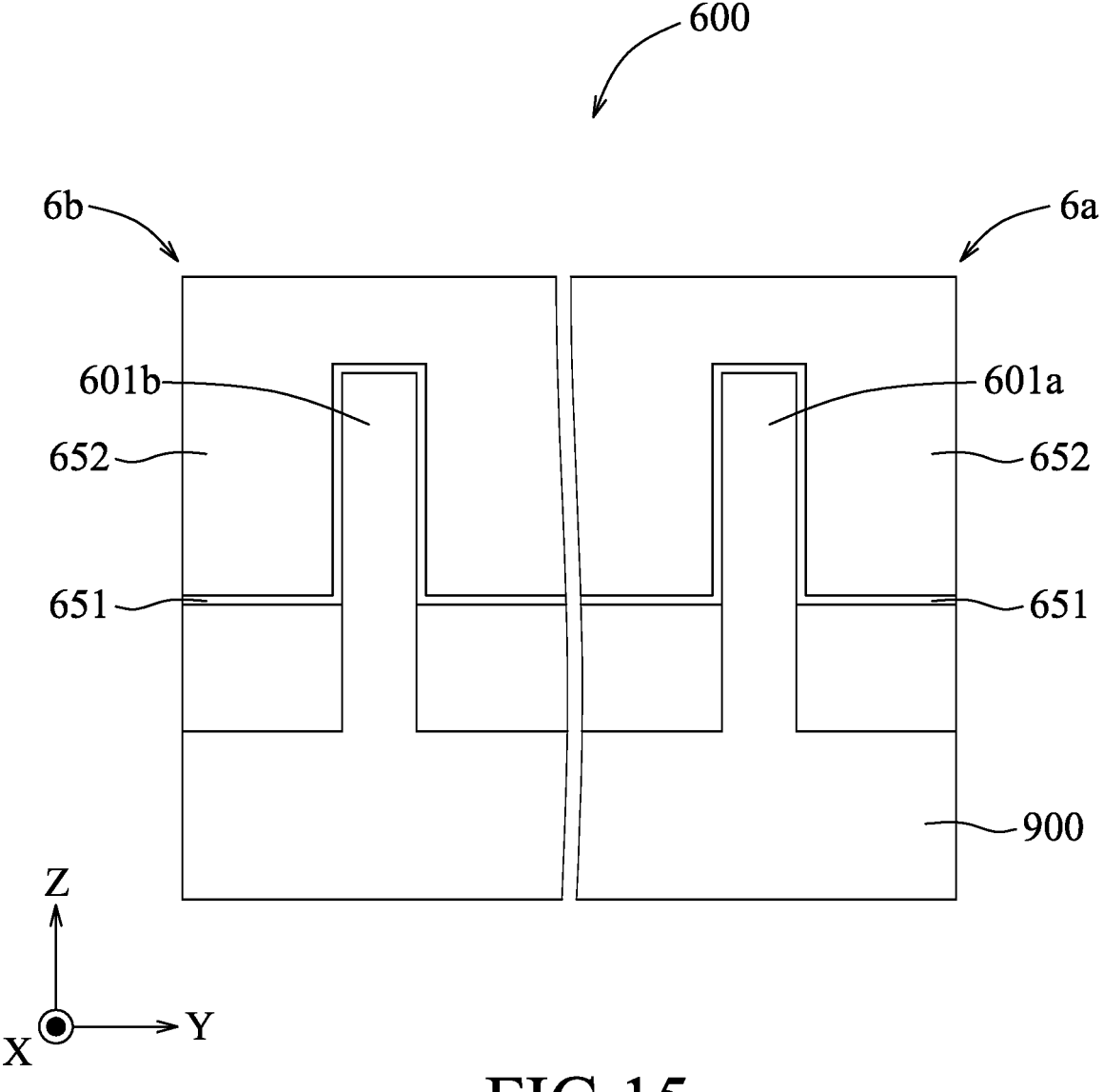
Figure 16:
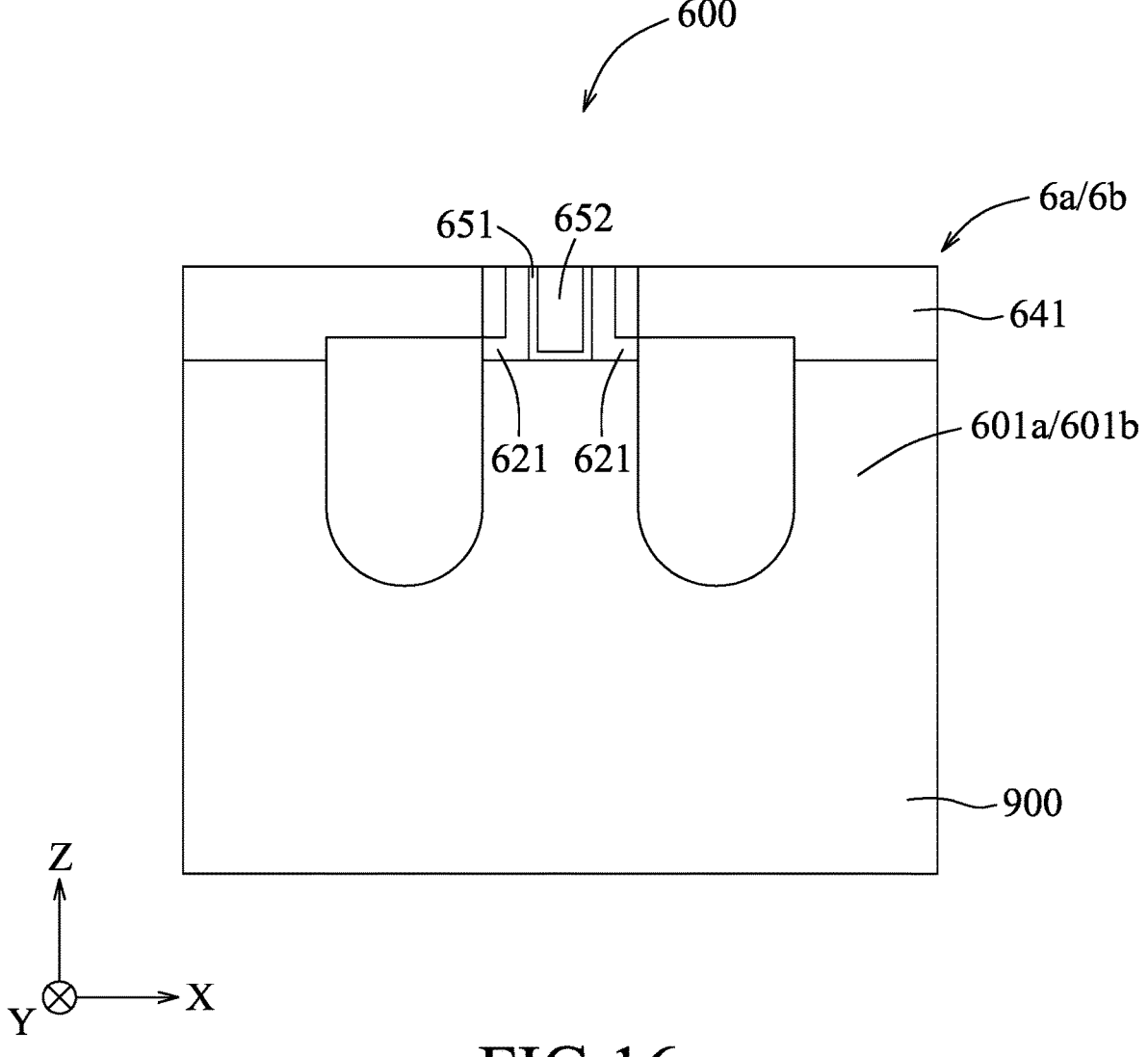

Referring to FIGS. 3, 15 and 16, the method 300 begins at step 31, where a first transistor (6b) and a second transistor (6a) are formed on a substrate 900. The first transistor (6b) would serve as the first transistor 11 (see FIG. 1). The second transistor (6a) would serve as the second transistor 12 (see FIG. 2). In some embodiments where each of the first transistor (6b) and the second transistor (6a) is a FinFET, step 31 may include sub-steps 311-316 as shown in FIG. 4.

Figure 5:
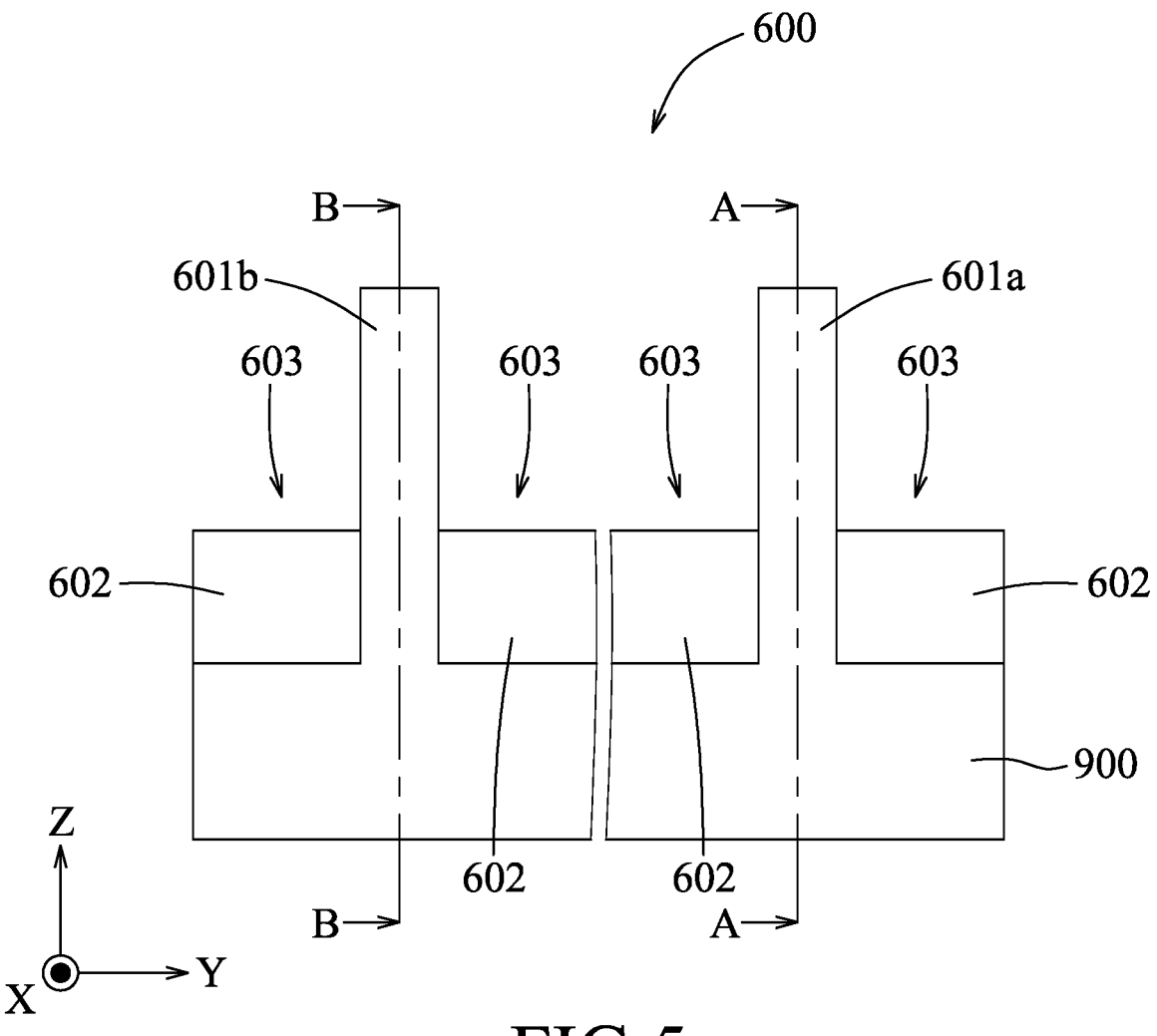
FIGS. 5 to 22 are schematic sectional views illustrating intermediate stages of the method for manufacturing a semiconductor device in accordance with some embodiments, where
Figure 6:
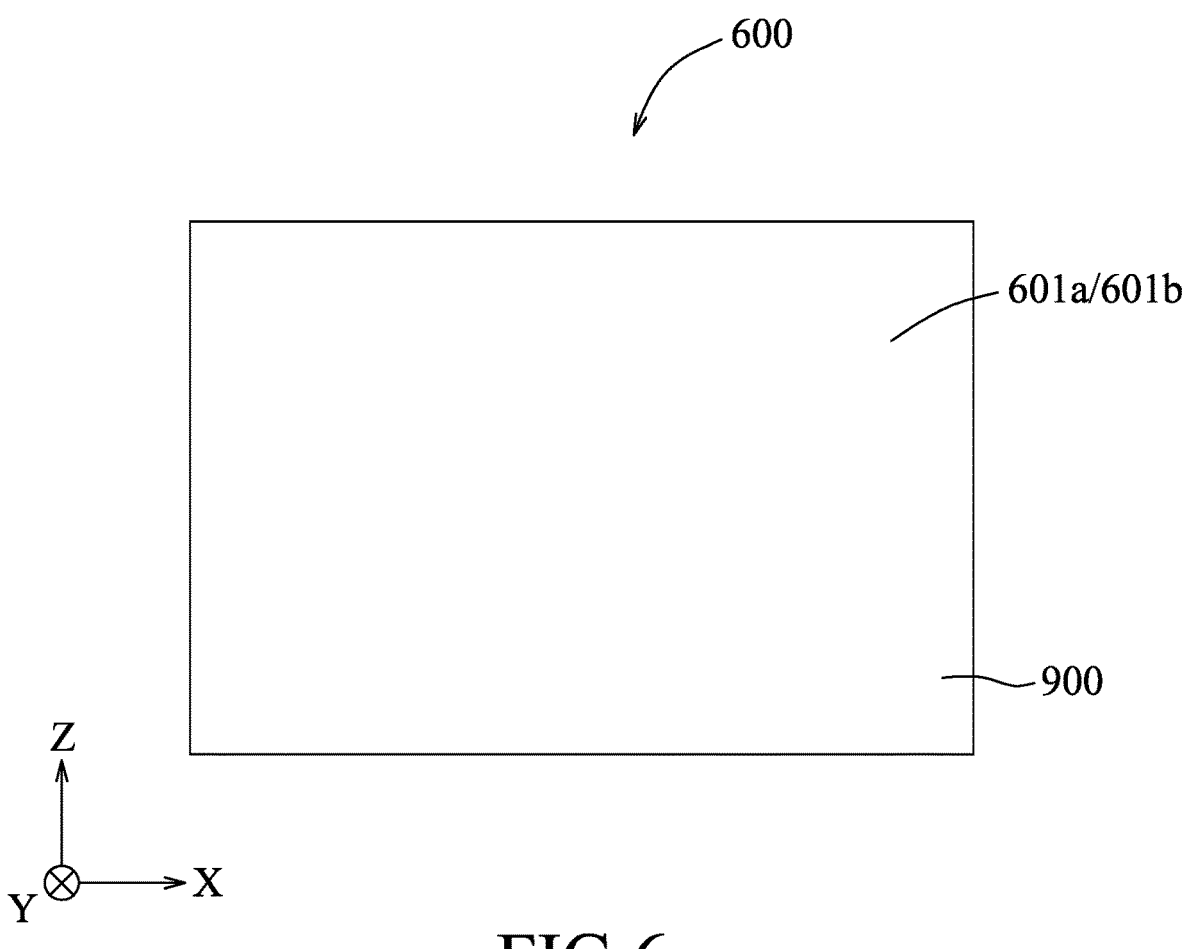

Referring to FIGS. 4, 5 and 6, where FIG. 6 illustrates a schematic sectional view taken along any one of line A-A and line B-B of FIG. 5, in sub-step 311, the substrate 900 is patterned to form two fin structures (601b, 601a) that respectively correspond to the first transistor (6b) and the second transistor (6a) (see FIGS. 15 and 16), and then a plurality of shallow trench isolations (STIs) 602 are formed to fill lower portions of a plurality of recesses 603 that define the fin structures (601b, 601a). In some embodiments, the substrate 900 may be patterned using a photolithography process and an etching process. The photolithography process may include, for example, but not limited to, coating the substrate 900 with a photoresist, soft-baking, exposing the photoresist through a photomask, post-exposure baking, developing the photoresist, and hard-baking, so as to form a patterned photoresist. The etching process may be implemented by etching the substrate 900 through the patterned photoresist using, for example, dry etching, wet etching, reactive ion etching (RIE), atomic layer etching (ALE), other suitable techniques, or combinations thereof. The patterned photoresist may be removed after the etching process. In some embodiments, the STIs 602 may be formed by: (a) depositing a dielectric layer for forming the STIs 602 on the substrate 900 and the fin structures (601b, 601a) using, for example, chemical vapor deposition (CVD), plasma enhanced chemical vapor deposition (PECVD), physical vapor deposition (PVD), atomic layer deposition (ALD), other suitable techniques, or combinations thereof; (b) removing an excess of the dielectric layer using, for example, chemical mechanical polishing (CMP), or other suitable planarization techniques, so as to expose top surfaces of the fin structures (601b, 601a); and (c) etching back the dielectric layer using, for example, dry etching, wet etching, RIE, ALE, other suitable techniques, or combinations thereof, so as to form the STIs 602. In some embodiments, the substrate 900 may be a silicon substrate. In some embodiments, the dielectric layer for forming the STIs 602 may include, for example, silicon oxide, silicon nitride, silicon oxynitride, high dielectric constant materials, other suitable materials, or combinations thereof.

Figure 7:
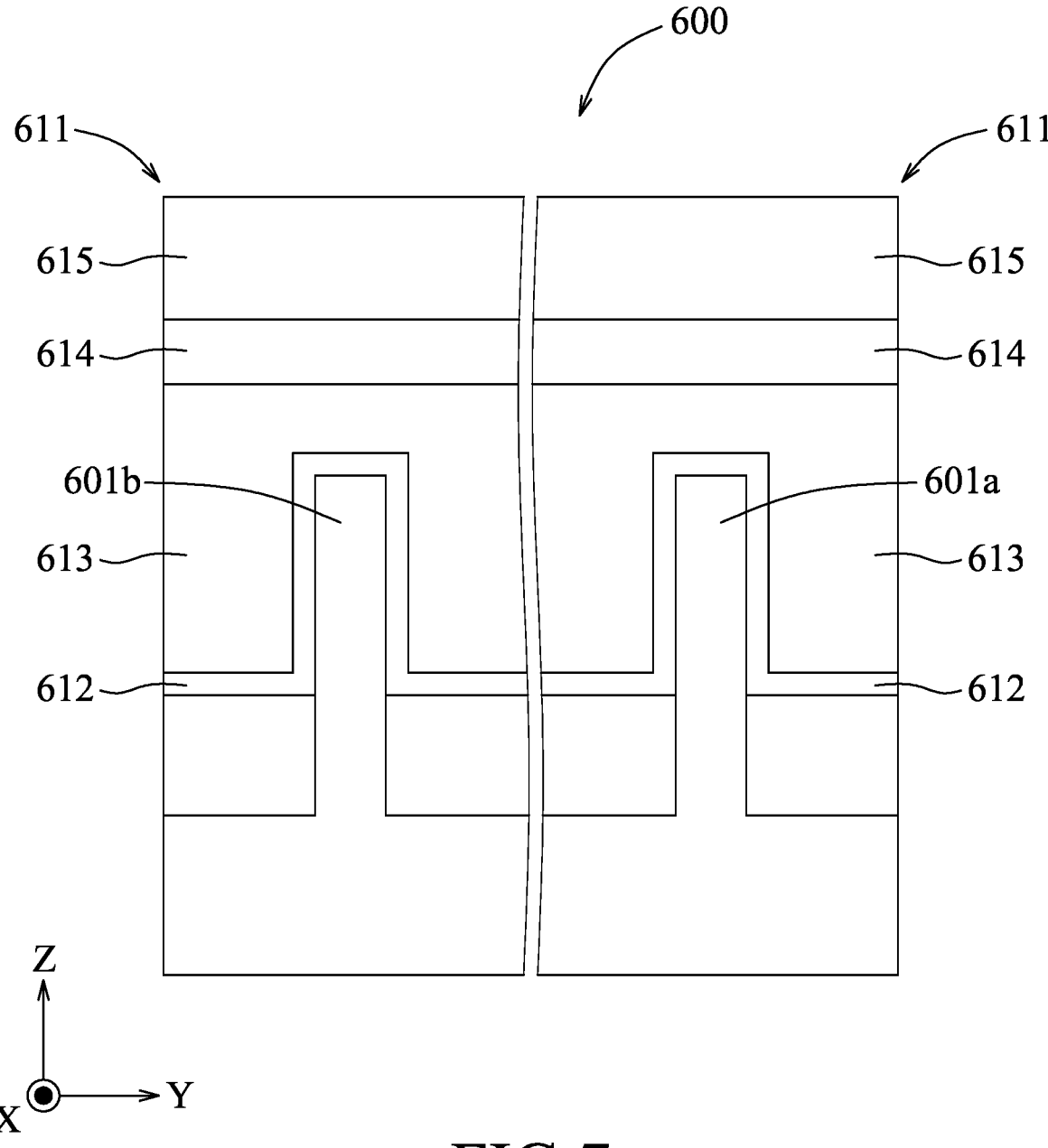
Figure 8:
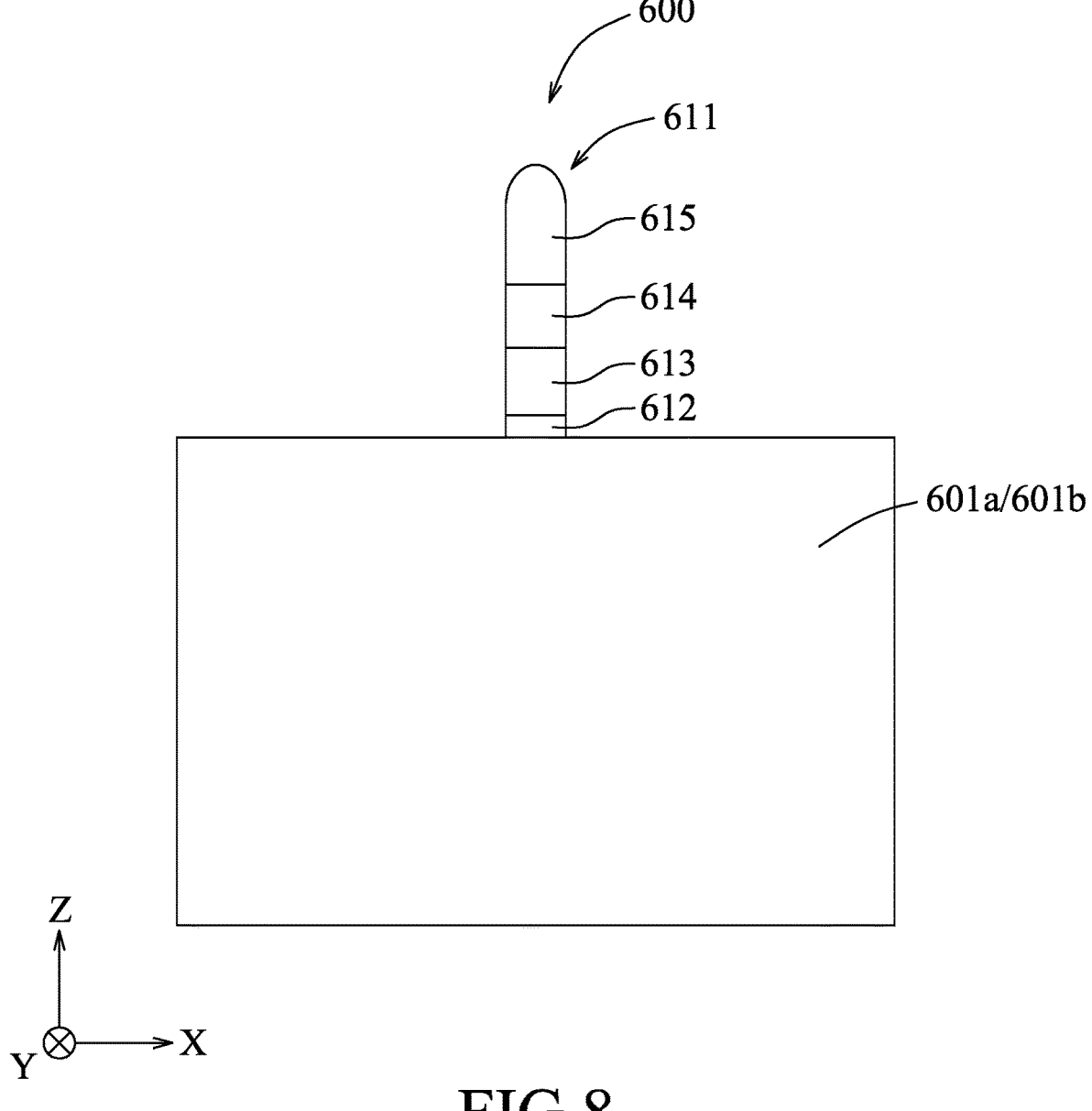

Referring to FIGS. 4, 7 and 8, where FIG. 8 is a view similar to FIG. 6, in sub-step 312, two dummy gate stacks 611 are respectively formed over the fin structures (601b, 601a) and fill upper portions of the recesses 603 (see FIG. 5). Each of the dummy gate stacks 611 includes a dummy gate dielectric 612, a dummy gate electrode 613, a polish-stop layer 614 and a hard mask layer 615 that are arranged from bottom to top. In some embodiments, the dummy gate stacks 611 may be formed by: (a) sequentially depositing a first layer for forming the dummy gate dielectrics 612 of the dummy gate stacks 611, a second layer for forming the dummy gate electrodes 613 of the dummy gate stacks 611, a third layer for forming the polish-stop layers 614 of the dummy gate stacks 611 and a fourth layer for forming the hard mask layers 615 of the dummy gate stacks 611 using, for example, CVD, PECVD, PVD, ALD, other suitable techniques, or combinations thereof; and (b) patterning the first to fourth layers to form the dummy gate dielectrics 612, the dummy gate electrodes 613, the polish-stop layers 614 and the hard mask layers 615 of the dummy gate stacks 611 using a photolithography process and an etching process similar to those used to pattern the substrate 900 in sub-step 311. In some embodiments, the first layer for forming the dummy gate dielectrics 612 may include, for example, silicon oxide, silicon nitride, silicon oxynitride, high dielectric constant materials, other suitable materials, or combinations thereof. In some embodiments, the second layer for forming the dummy gate electrodes 613 may include, for example, polycrystalline silicon, single crystalline silicon, amorphous silicon, other suitable materials, or combinations thereof. In some embodiments, the third layer for forming the polish-stop layers 614 may include, for example, silicon nitride, silicon oxide, other nitrides, other oxides, other suitable materials, or combinations thereof. In some embodiments, the fourth layer for forming the hard mask layers 615 may include, for example, silicon nitride, silicon oxide, silicon oxynitride, other suitable materials, or combinations thereof.

Figure 9:
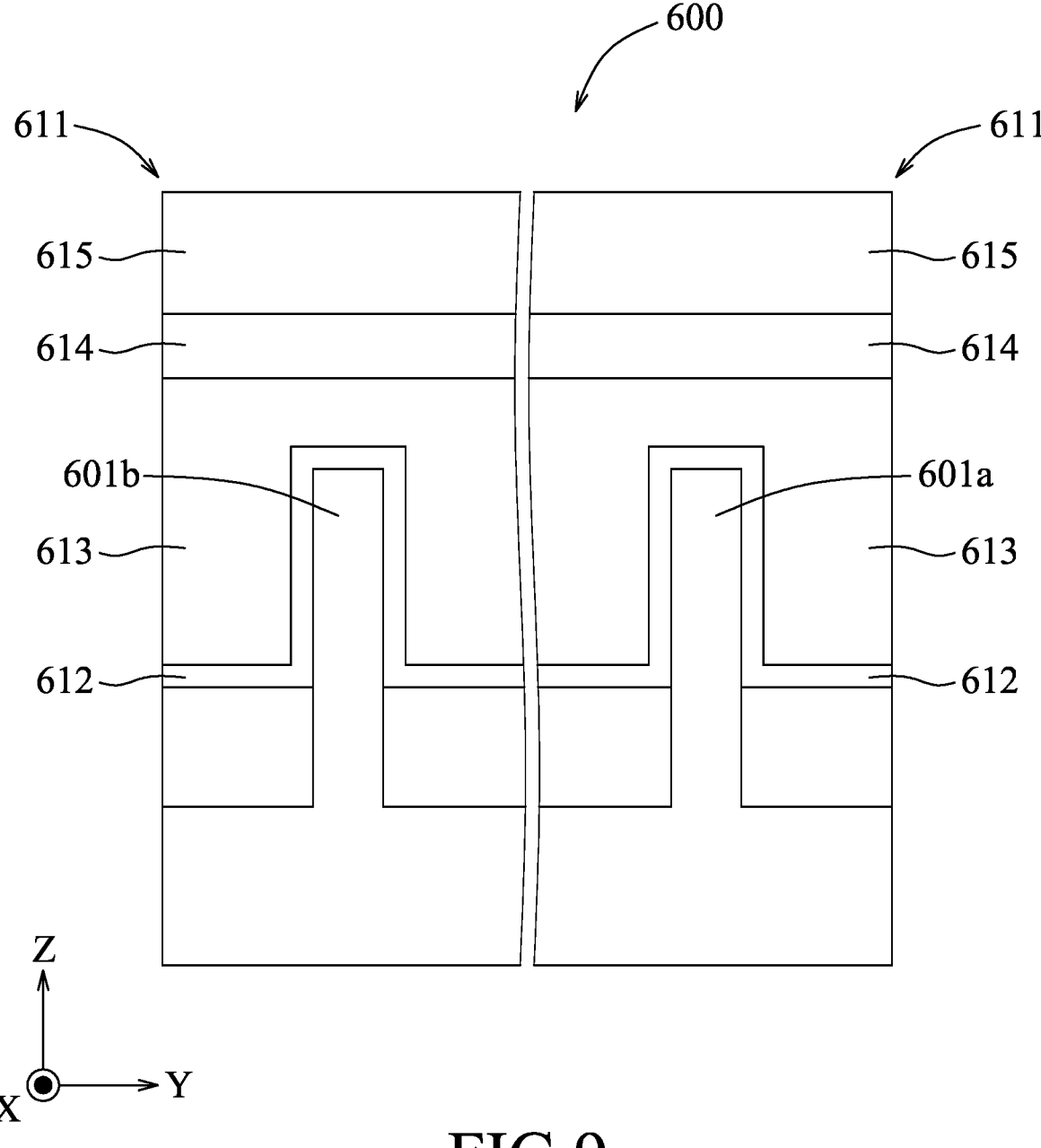
Figure 10:
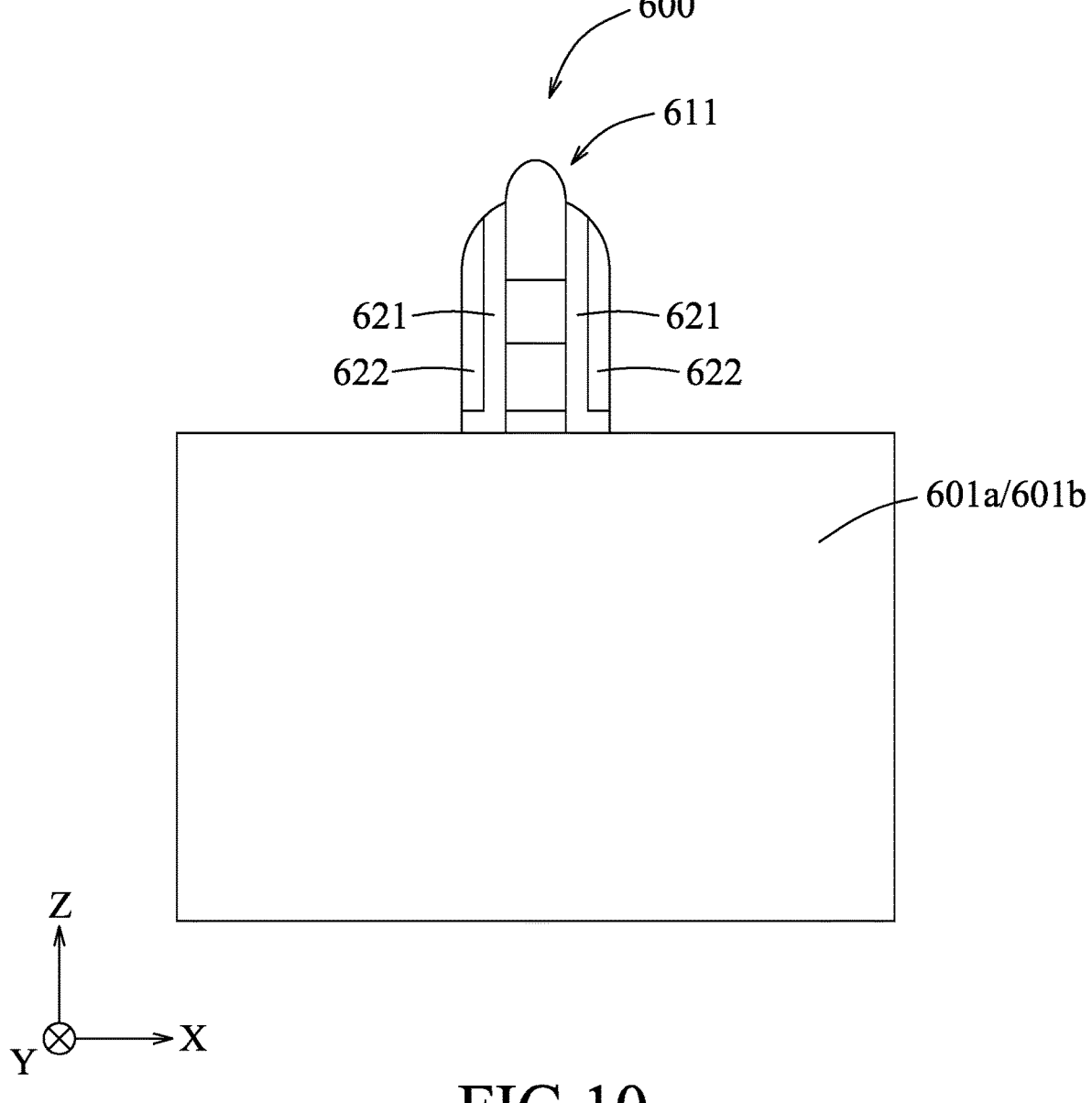

Referring to FIGS. 4, 9 and 10, where FIG. 10 is a view similar to FIG. 6, in sub-step 313, with respect to each of the dummy gate stacks 611, a plurality of first gate spacers 621 are respectively formed on sidewalls of the dummy gate stack 611, and a plurality of second gate spacers 622 are respectively formed on the first gate spacers 621. In some embodiments, the first gate spacers 621 and the second gate spacers 622 that cover the dummy gate stacks 611 may be formed by conformally and sequentially depositing a first dielectric layer for forming the first gate spacers 621 and a second dielectric layer for forming the second gate spacers 622 using, for example, CVD, ALD, other suitable techniques, or combinations thereof, followed by one or more etching processes to selectively leave the first and second spacers 621, 622 remaining on the sidewalls of the dummy gate stacks 611. In some embodiments, the first dielectric layer for forming the first gate spacers 621 may include, for example, a silicon-carbon-containing material, a silicon-oxide-containing material, other suitable materials, or combinations thereof. In some embodiments, the second dielectric layer for forming the second gate spacers 622 may include, for example, silicon nitride, other suitable materials, or combinations thereof.

Figure 11:
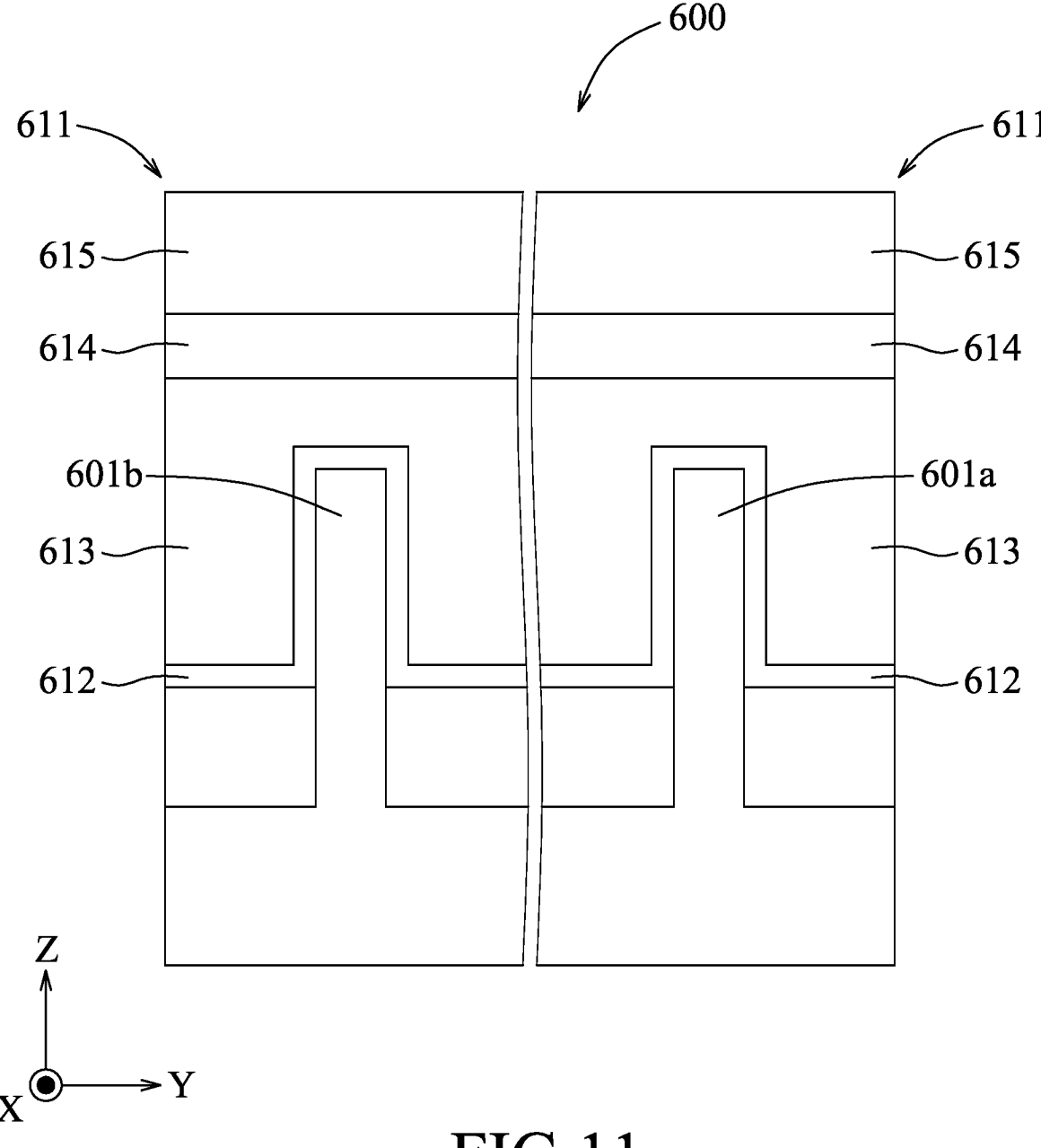
Figure 12:
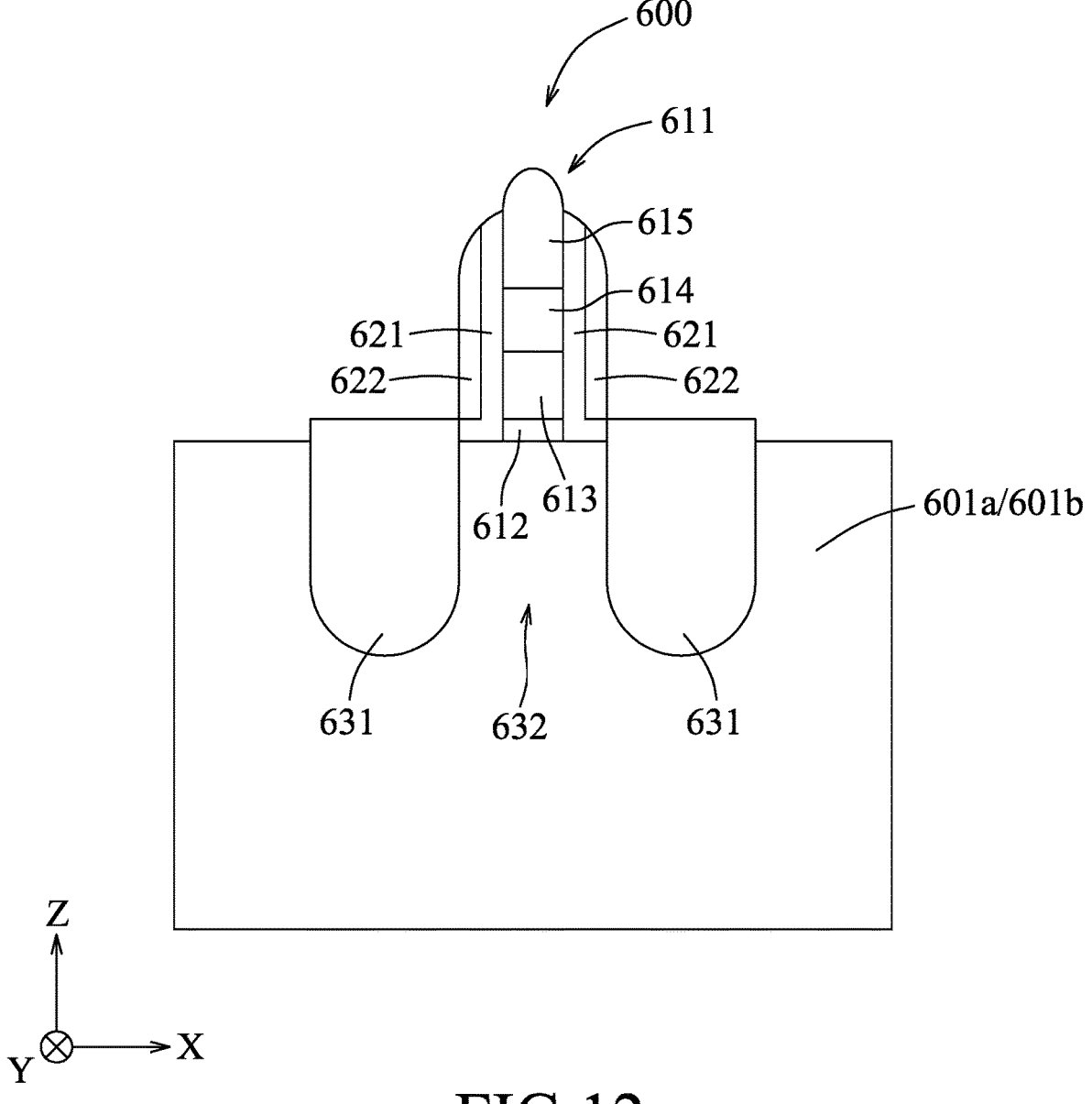
Figure 13:
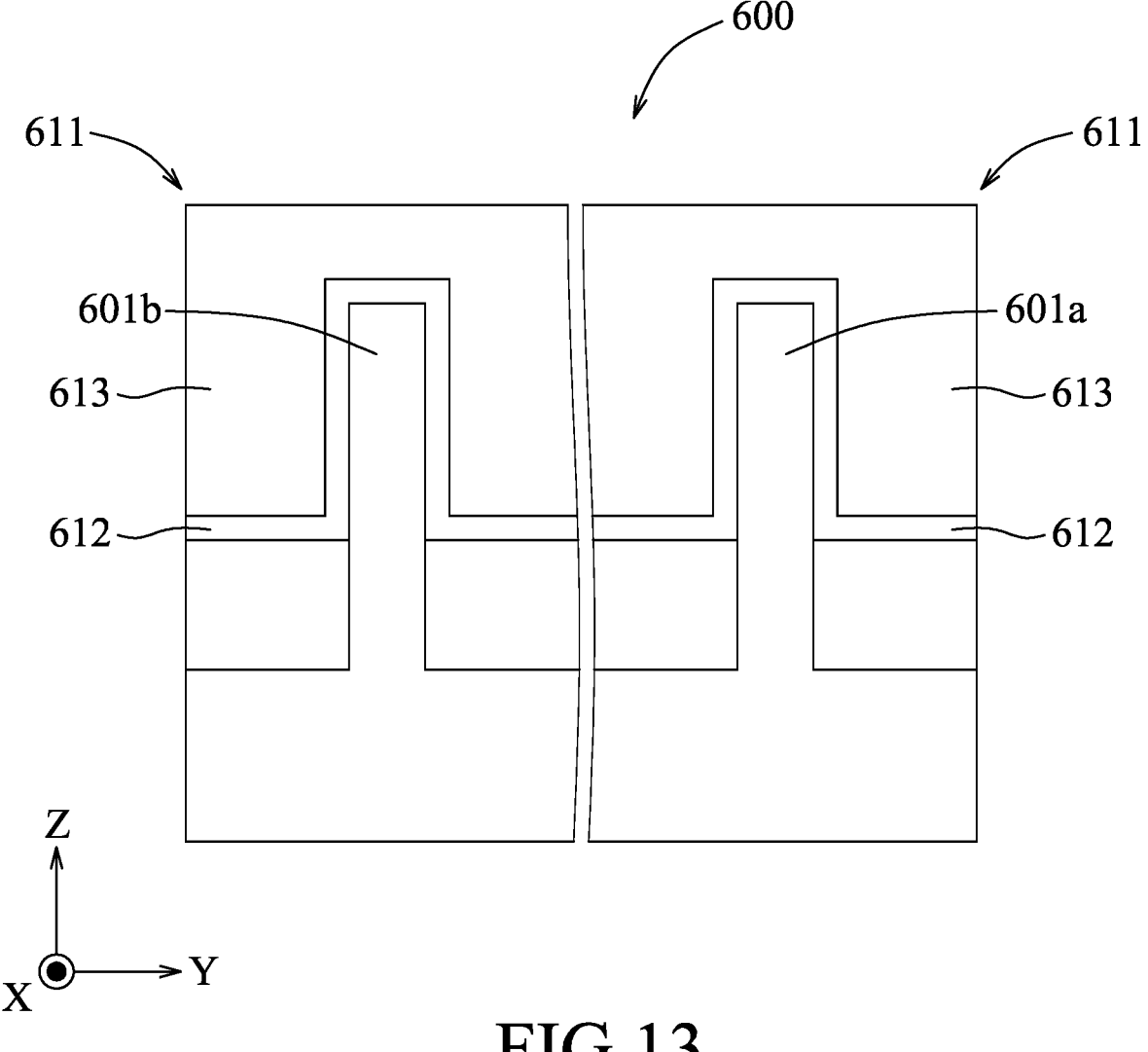

Referring to FIGS. 4, 11 and 12, where FIG. 12 is a view similar to FIG. 6, in sub-step 314, with respect to each of the fin structures (601b, 601a), two source/drain electrodes 631 are formed in the fin structure (601b/601a) at positions exposed from the corresponding dummy gate stack 611, the corresponding first gate spacers 621 and the corresponding second gate spacers 622. The two source/drain electrodes 631 formed in the fin structure (601b) would serve as the source/drain electrodes 111 of the first transistor 11 (see FIG. 1), and a region 632 of the fin structure (601b) located between these two source/drain electrodes 631 would serve as the channel 112 of the first transistor 11 (see FIG. 1). The two source/drain electrodes 631 formed in the fin structure (601a) would serve as the source/drain electrodes 121 of the second transistor 12 (see FIG. 2), and a region 632 of the fin structure (601a) located between these two source/drain electrodes 631 would serve as the channel 122 of the second transistor 12 (see FIG. 2). In some embodiments, the fin structures (601b, 601a) may be etched using, for example, dry etching, wet etching, RIE, ALE, other suitable techniques, or combinations thereof, so as to form recesses at the positions exposed from the dummy gate stacks 611, the first gate spacers 621 and the second gate spacers 622; and the source/drain electrodes 631 may be epitaxially formed in the recesses using, for example, low pressure chemical vapor deposition (LPCVD), other suitable techniques, or combinations thereof. In some embodiments, the source/drain electrodes 631 may include, for example, crystalline silicon (or other suitable materials) doped with an n-type impurity or a p-type impurity.

Figure 14:
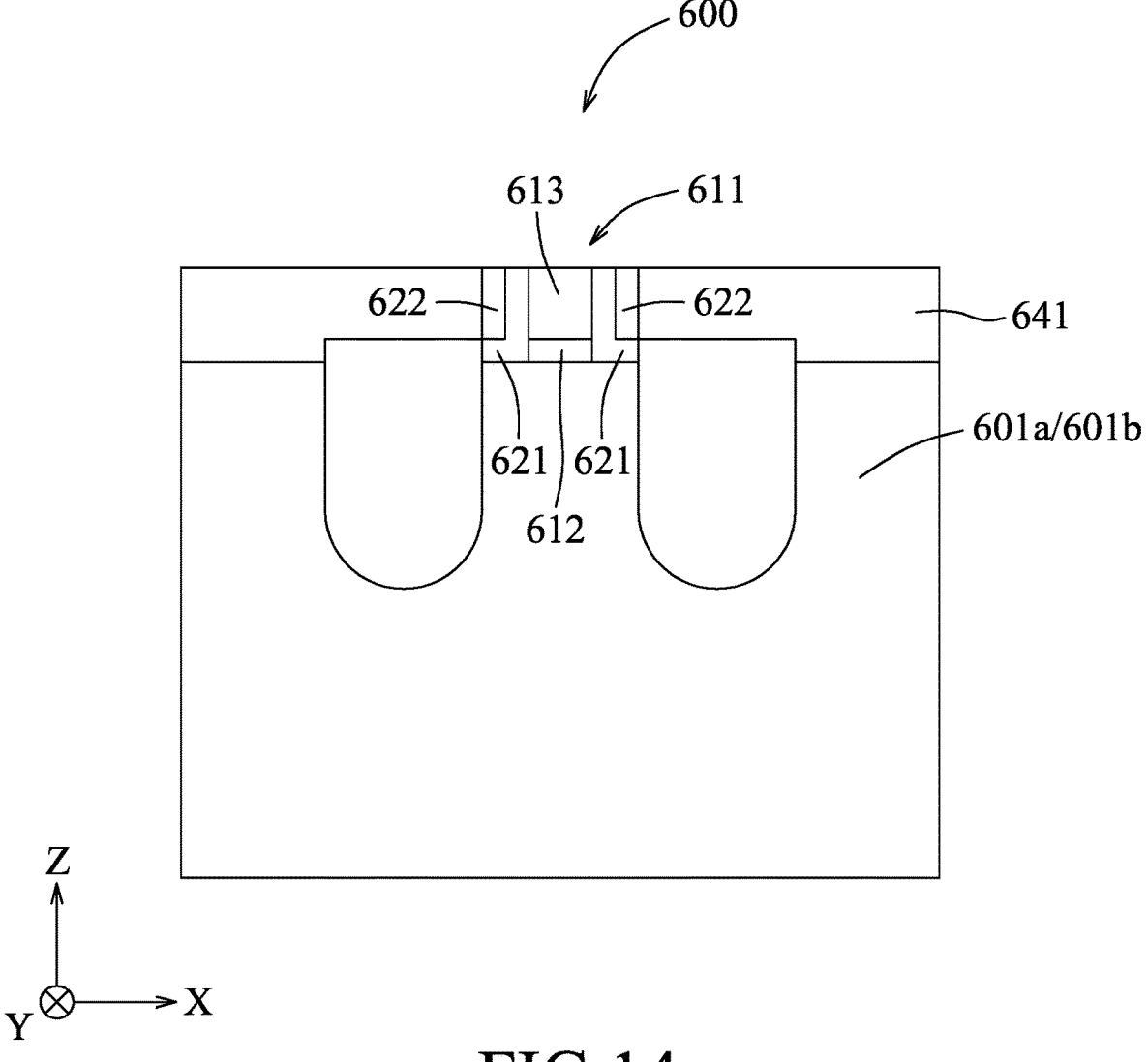

Referring to FIGS. 4, 11, 12, 13 and 14, where FIG. 14 is a view similar to FIG. 6, in sub-step 315, an inter-layer dielectric (ILD) 641 is formed to surround the dummy gate dielectrics 612 and the dummy gate electrodes 613 of the dummy gate stacks 611 that have been covered by the first gate spacers 621 and the second gate spacers 622. In some embodiments, the ILD 641 may be formed by: (a) depositing a dielectric layer for forming the ILD 641 over the semiconductor structure 600 depicted in FIGS. 11 and 12 using, for example, CVD, PECVD, PVD, ALD, other suitable techniques, or combinations thereof; (b) removing an excess of the dielectric layer, the hard mask layers 615 and the polish-stop layers 614 of the dummy gate stacks 611, excesses of the first gate spacers 621 and excesses of the second gate spacers 622 using, for example, CMP, or other suitable planarization techniques, so as to expose top surfaces of the dummy gate electrodes 613 of the dummy gate stacks 611, thereby forming the ILD 641. In some embodiments, the dielectric layer for forming the ILD 641 may include, for example, silicon oxide, silicon nitride, silicon oxynitride, other suitable materials, or combinations thereof.

Referring to FIGS. 4, 13, 14, 15 and 16, where FIG. 16 is a view similar to FIG. 6, in sub-step 316, with respect to each of the dummy gate stacks 611, the dummy gate electrode 613 and the dummy gate dielectric 612 of the dummy gate stack 611 are removed to form a recess between the corresponding first gate spacers 621, and then a gate dielectric 651 is conformally formed in the recess, and a gate electrode 652 is formed on the gate dielectric 651 in the recess. The gate electrode 652 formed over the fin structure (601b) would serve as the gate electrode 113 of the first transistor 11 (see FIG. 1). The gate electrode 652 formed over the fin structure (601a) would serve as the gate electrode 123 of the second transistor 12 (see FIG. 2). In some embodiments, the dummy gate electrodes 613 and the dummy gate dielectrics 612 of the dummy gate stacks 611 may be removed using, for example, dry etching, wet etching, RIE, ALE, other suitable techniques, or combinations thereof. In some embodiments, the gate dielectrics 651 and the gate electrodes 652 in the recesses formed from removal of the dummy gate stacks 611 may be formed by: (a) sequentially depositing a first layer for forming the gate dielectrics 651 and a second layer for forming the gate electrodes 652 on the ILD 641 and inner surfaces of the recesses using, for example, CVD, PECVD, PVD, ALD, other suitable techniques, or combinations thereof, so as to fill the recesses; and (b) removing an excess of the second layer and an excess of the first layer using, for example, CMP, or other suitable planarization techniques to expose a top surface of the ILD 641, so as to form the gate dielectrics 651 and the gate electrodes 652. In some embodiments, the first layer for forming the gate dielectrics 651 may include, for example, silicon oxide, silicon nitride, silicon oxynitride, high dielectric constant materials, other suitable materials, or combinations thereof. In some embodiments, the second layer for forming the gate electrodes 652 may include, for example, titanium, aluminum, tantalum carbide, tantalum carbide nitride, tantalum silicon nitride, tungsten, copper, other suitable materials, or combinations thereof.

Figure 17:
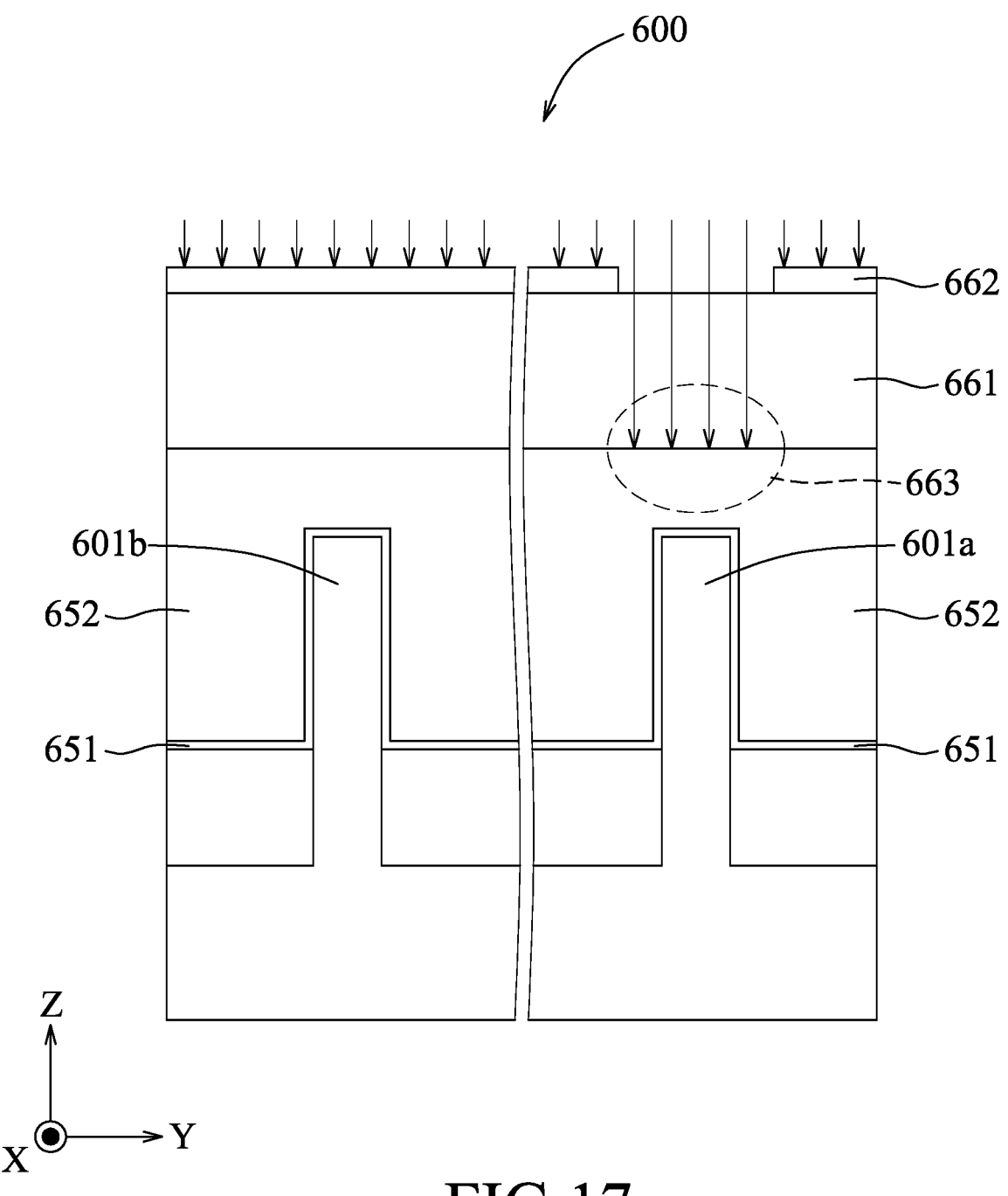
Figure 18:
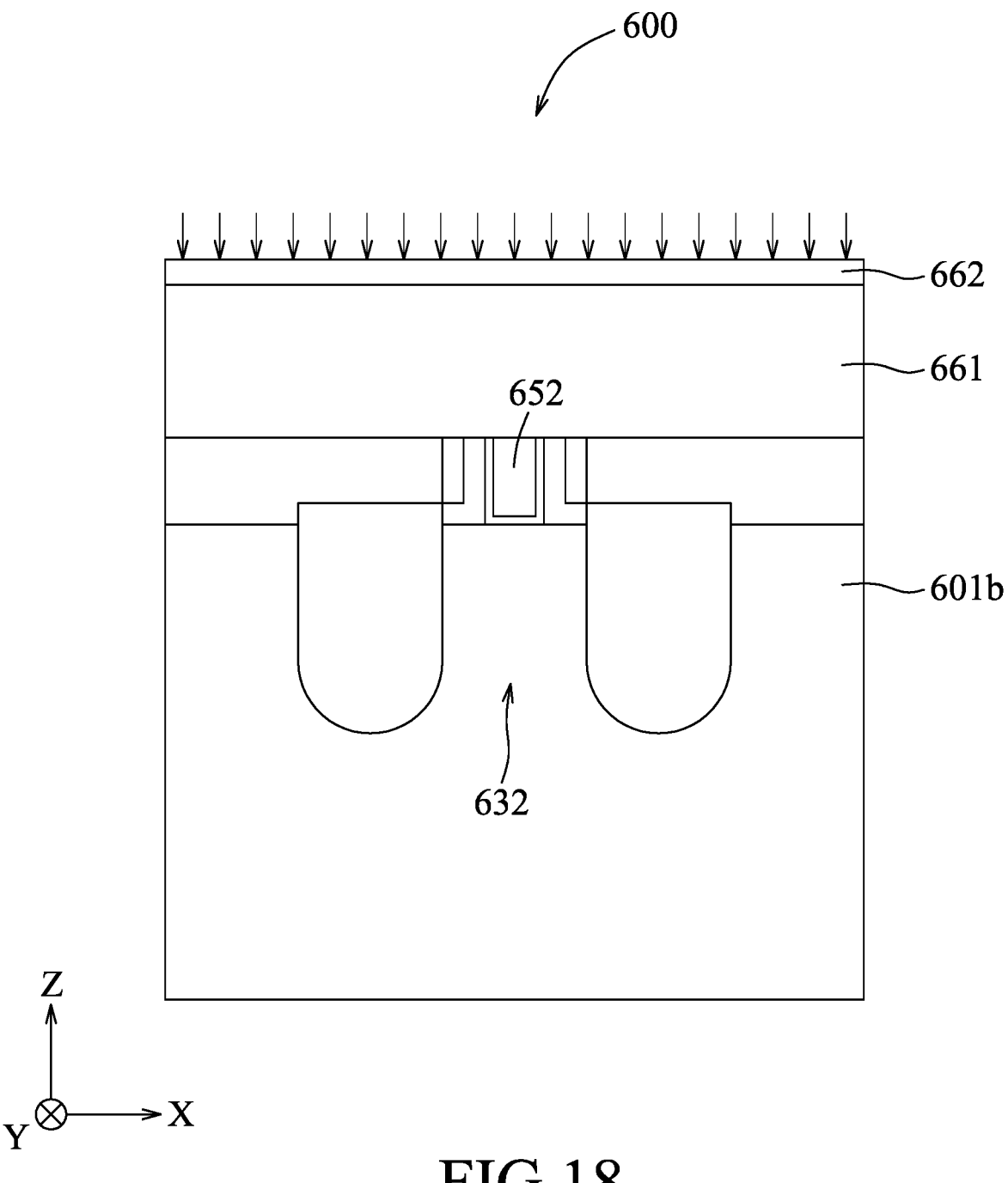
Figure 19:
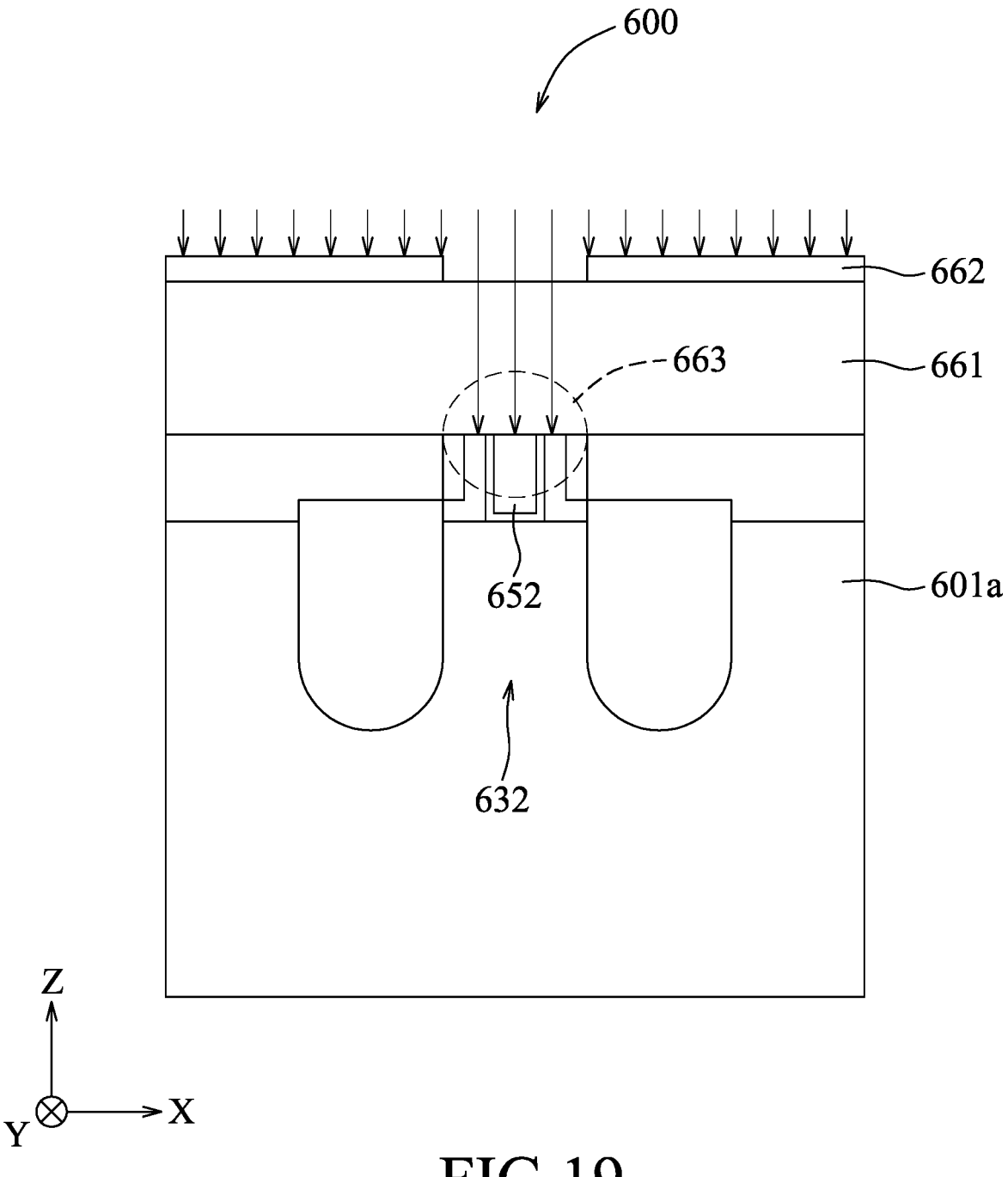
Figure 20:
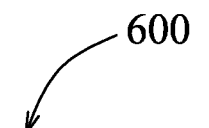

Referring to FIGS. 3, 17, 18 and 19, where FIGS. 18 and 19 are views similar to FIG. 6, the method 300 then proceeds to step 32, where a dielectric layer 661 is formed on the semiconductor structure 600 depicted in FIGS. 15 and 16, and then a portion of the gate electrode 652 formed over the fin structure (601a) is treated. The portion of the gate electrode 652 formed over the fin structure (601a) is at the top of the gate electrode 652 (i.e., being an upper portion of the gate electrode 652), and corresponds in position to the region 632 of the fin structure (601a). In some embodiments, the dielectric layer 661 may be formed on the semiconductor structure 600 depicted in FIGS. 15 and 16 using, for example, CVD, PECVD, PVD, ALD, other suitable deposition techniques, or combinations thereof. In some embodiments, the dielectric layer 661 may include, for example, silicon oxide, silicon nitride, silicon oxynitride, other suitable materials, or combinations thereof. In some embodiments, the portion of the gate electrode 652 formed over the fin structure (601a) may be treated by: (a) coating a masking layer on the dielectric layer 661; (b) patterning the masking layer to form a patterned masking layer 662 that has an opening in position corresponding to the region 632 of the fin structure (601a); and (c) performing, for example, implantation, bombardment, other suitable techniques, or combinations thereof on the semiconductor structure 600 as shown in FIGS. 17, 18 and 19, so as to treat a region 663 of the semiconductor structure 600 that includes the portion of the gate electrode 652 formed over the fin structure (601a). The patterned masking layer 662 may be removed after the portion of the gate electrode 652 formed over the fin structure (601a) is treated. In some embodiments, the masking layer may be a photoresist or a hard mask. In some embodiments, the implantation may be performed using a material selected from, for example, nitride (N), boron (B), fluorine (F), other suitable materials, and combinations thereof, so the portion of the gate electrode 652 formed over the fin structure (601a) further includes the material. In some embodiments, the implantation may be performed at, for example, but not limited to, about room temperature. In some embodiments, energy and/or time of the implantation may be adjusted to change a position of the region 663 in a direction perpendicular to the semiconductor structure 600. In some embodiments, the bombardment may be performed using a material selected from, for example, oxygen (O), argon (Ar), krypton (Kr), helium (He), other suitable materials, and combinations thereof, so the portion of the gate electrode 652 formed over the fin structure (601a) further includes the material. In some embodiments, the bombardment may be performed at, for example, but not limited to, about room temperature. In some embodiments, energy and/or time of the bombardment may be adjusted to change the position of the region 663 in the direction perpendicular to the semiconductor structure 600. It should be noted that the region 663 has a substantially flat bottom surface when the opening of the patterned masking layer 662 is wide, and has a curved bottom surface when the opening of the patterned masking layer 662 is narrow.

Figure 21:
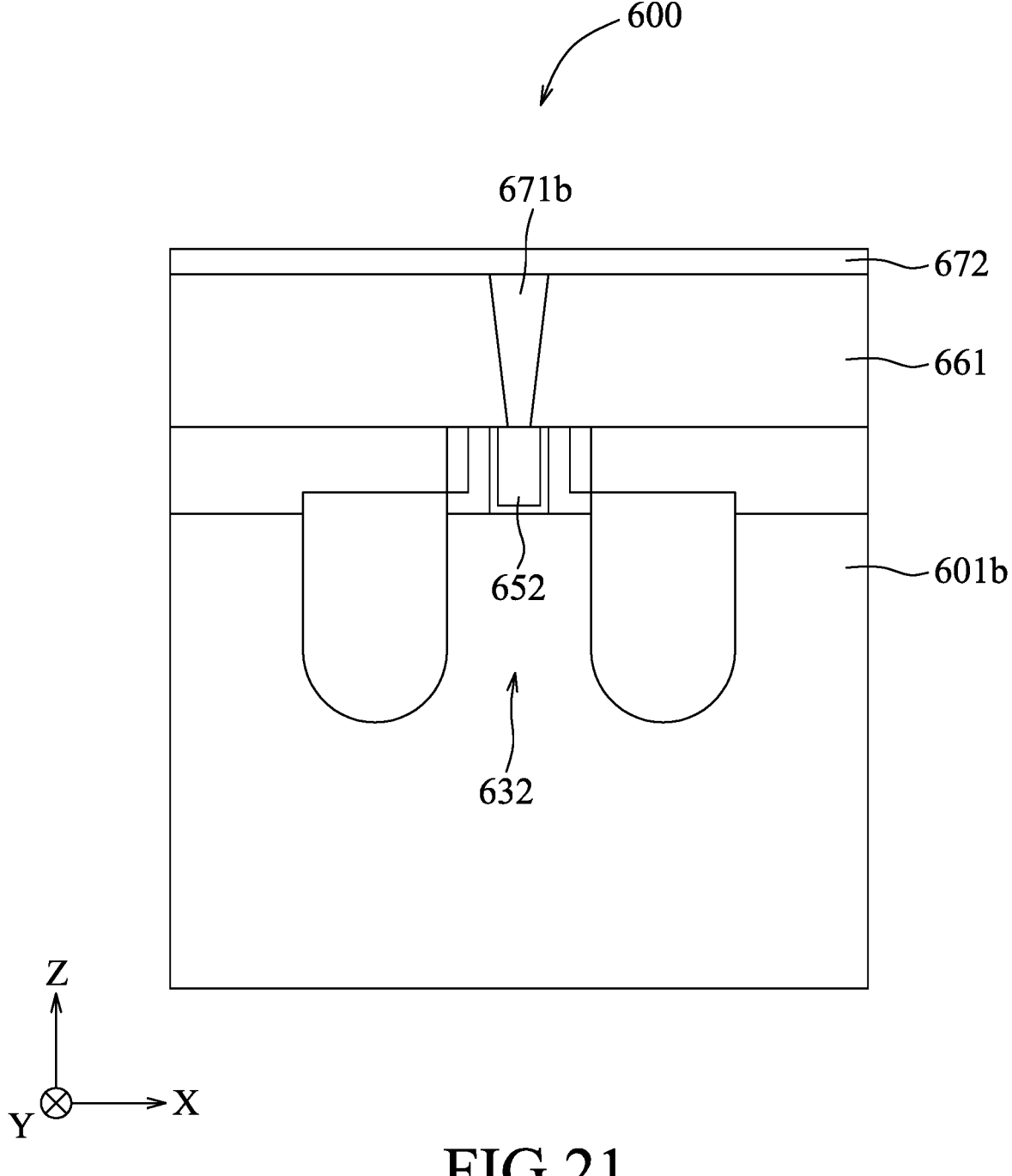
Figure 22:
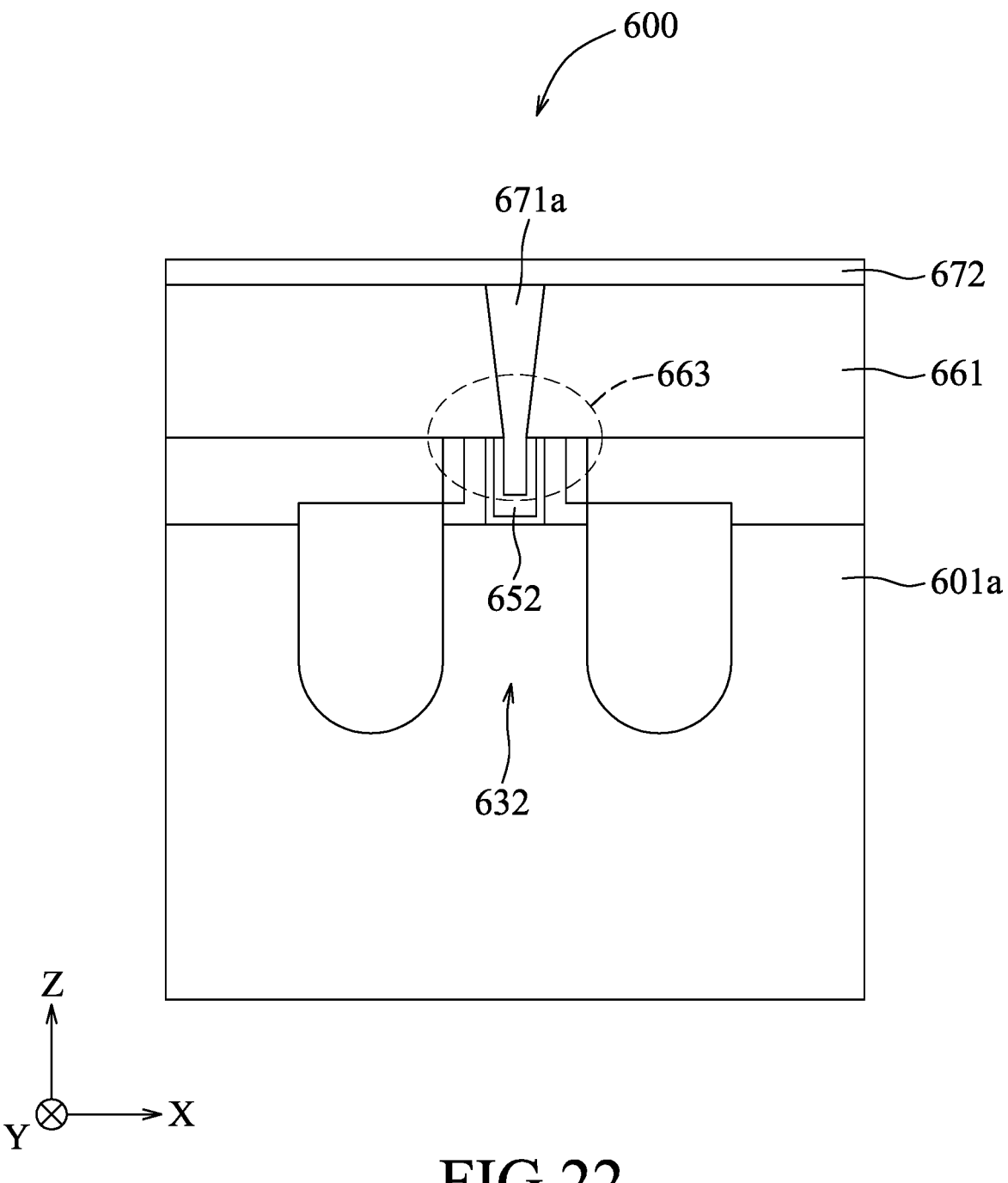

Referring to FIGS. 3, 20, 21 and 22, where FIGS. 21 and 22 are views similar to FIG. 6, the method 300 then proceeds to step 33, where a first via contact (671b) is formed in the dielectric layer 661, and a second via contact (671a) is formed in the dielectric layer 661 and the gate electrode 652 formed over the fin structure (601a). The first via contact (671b) corresponds in position to the region 632 of the fin structure (601b), and would serve as the first via contact 13 (see FIG. 1). The second via contact (671a) corresponds in position to the region 632 of the fin structure (601a), and would serve as the second via contact 14 (see FIG. 2). Moreover, in step 33, a conductive layer 672 is formed on the dielectric layer 661, the first via contact (671b) and the second via contact (671a). In some embodiments, the first via contact (671b) and the second via contact (671a) may be formed by: (a) patterning the semiconductor structure 600 depicted in FIGS. 17, 18 and 19 using a photolithography process and an etching process similar to those used to pattern the substrate 900 (see FIG. 5) in sub-step 311 (see FIG. 4), so as to form a first recess that corresponds in position to the region 632 of the fin structure (601b) and that exposes a top surface of the gate electrode 652 formed over the fin structure (601b), and a second recess that corresponds in position to the region 632 of the fin structure (601a) and that extends into the treated portion of the gate electrode 652 formed over the fin structure (601a); (b) depositing a conductive material for forming the first via contact (671b) and the second via contact (671a) on the dielectric layer 661 and in the first recess and the second recess using, for example, CVD. PECVD, PVD, ALD, other suitable techniques, or combinations thereof; and (c) removing an excess of the conductive material using, for example, CMP, or other suitable planarization techniques, so as to expose a top surface of the dielectric layer 661, thereby forming the first via contact (671b) in the first recess and the second via contact (671a) in the second recess. It should be noted that the treated portion of the gate electrode 652 formed over the fin structure (601a) would be partially removed during the etching process, so the second recess can extend into the treated portion of the gate electrode 652 formed over the fin structure (601a). In some embodiments, the conductive material for forming the first via contact (671b) and the second via contact (671a) may include, for example, copper (Cu), cobalt (Co), ruthenium (Ru), molybdenum (Mo), chromium (Cr), tungsten (W), manganese (Mn), rhodium (Rh), iridium (Ir), nickel (Ni), palladium (Pd), platinum (Pt), silver (Ag), gold (Au), aluminum (Al), or alloys thereof. In some embodiments, the conductive layer 672 may be formed using, for example, CVD, PECVD, PVD, ALD, other suitable deposition techniques, or combinations thereof. In some embodiments, the conductive layer 672 may include, for example, Cu, Co, Ru, Mo, Cr, W, Mn, Rh, Ir, Ni, Pd. Pt, Ag, Au, Al, or alloys thereof.

FIGS. 23 and 24 are schematic sectional views of a semiconductor device in accordance with some embodiments. In some embodiments where each of the first transistor 11 and the second transistor 12 is a GAA FET as shown in FIGS. 23 and 24, with respect to each of the first transistor 11 and the second transistor 12, the channel 112/122 includes a plurality of channel portions 1121/1221; the gate electrode 113/123 surrounds the channel portions 1121/1221; and the lower portion of the second via contact 14 is surrounded by a top portion of the gate electrode 123 of the second transistor 12.

FIGS. 25 to 30 are schematic sectional views of semiconductor structures 700 during various stages of the method 300 as shown in FIG. 3 in accordance with some embodiments. The method 300 and the semiconductor structures 700 will be described below. Additional steps can be provided before, after or during the method 300, and some of the steps described herein may be replaced by other steps or be eliminated. Similarly, further additional features may be present in the semiconductor structures 700, and/or features present may be replaced or eliminated in additional embodiments.

Figure 25:
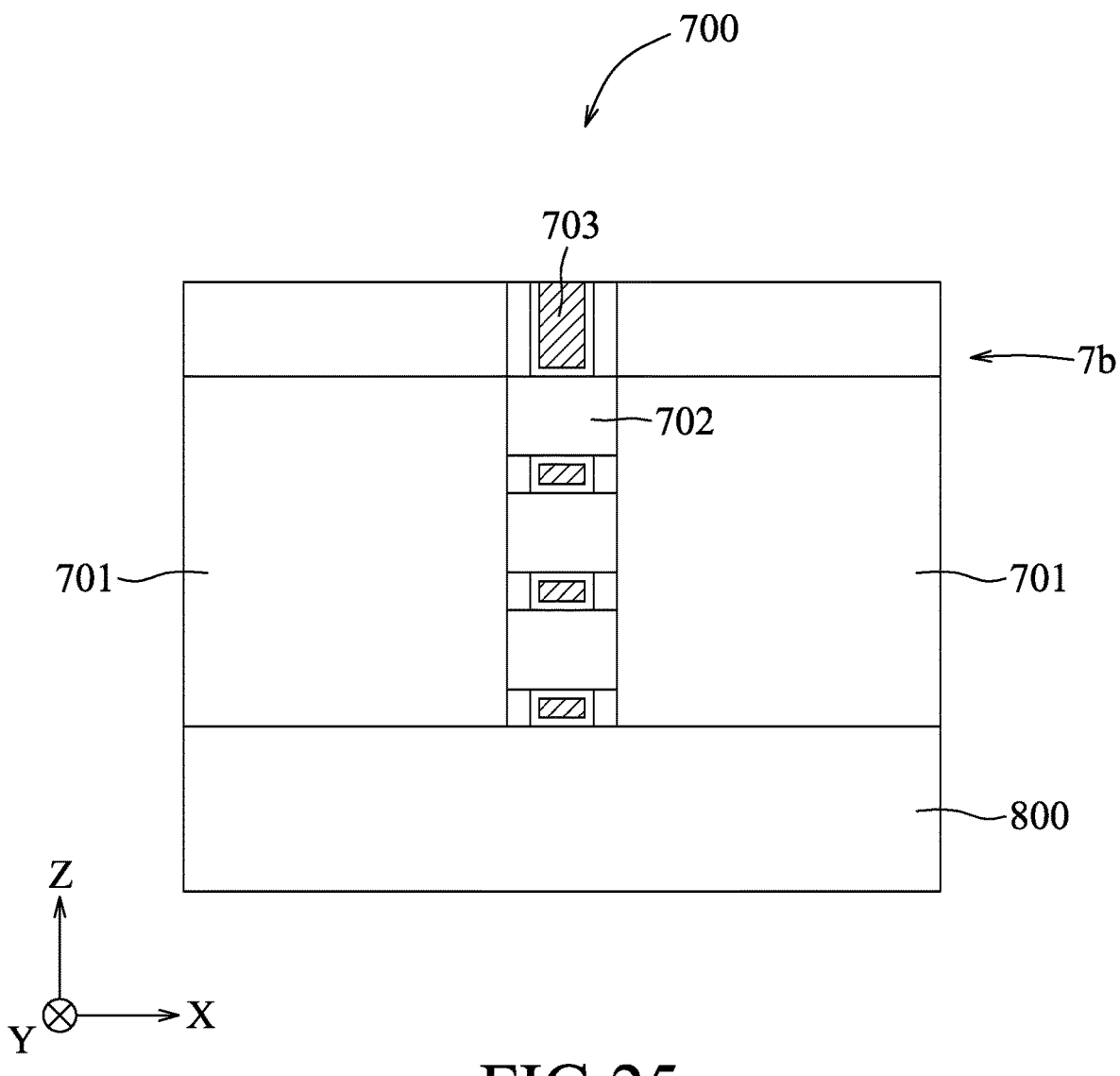
FIGS. 25 to 30 are schematic sectional views illustrating intermediate stages of a method for manufacturing a semiconductor device in accordance with some embodiments.
Figure 26:
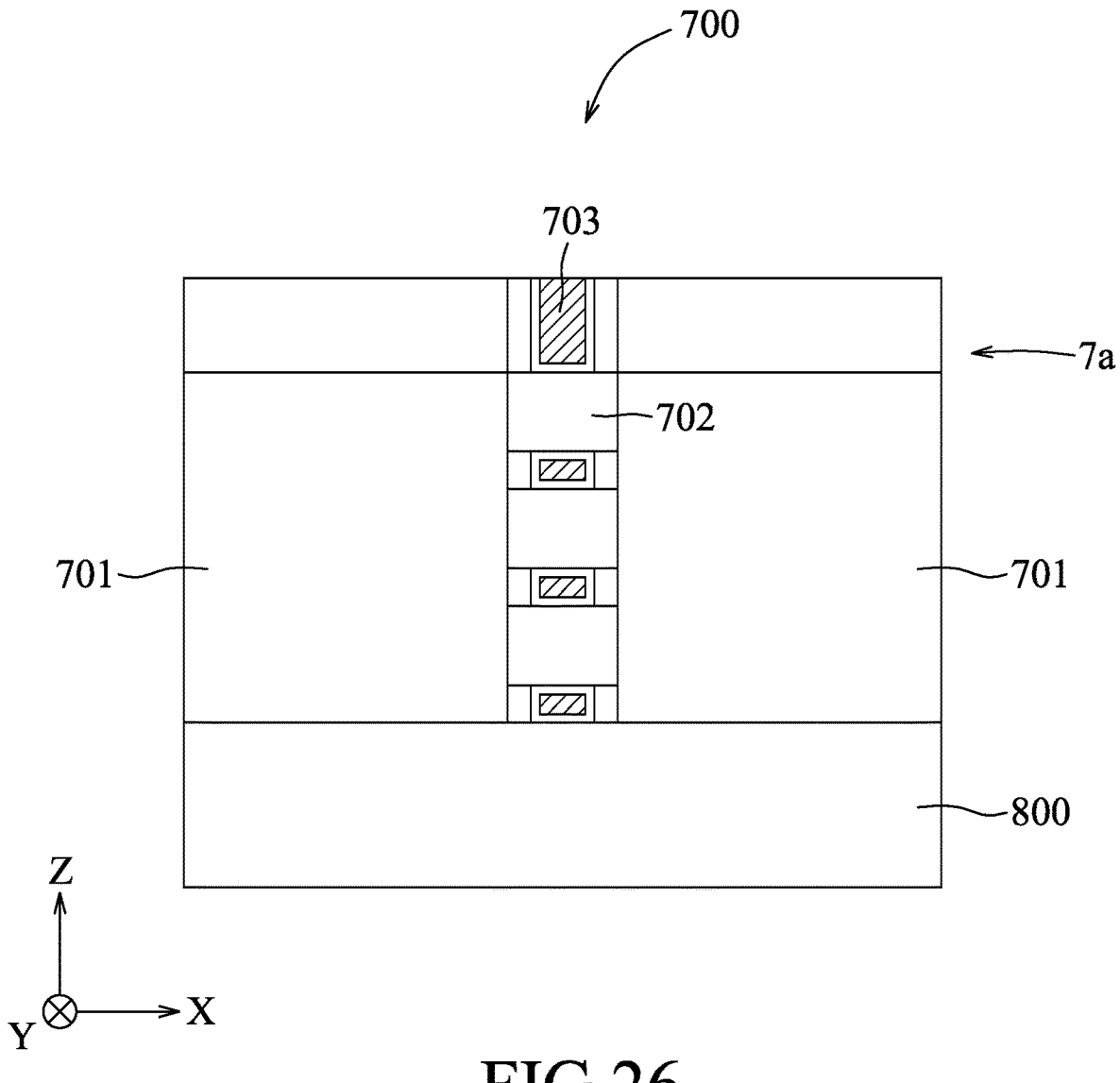

Referring to FIGS. 3, 25 and 26, the method 300 begins at step 31, where a first transistor (7b) and a second transistor (7a) are formed on a substrate 800. Each of the first transistor (7b) and the second transistor (7a) includes two source/drain electrodes 701, a channel 702 and a gate electrode 703. The source/drain electrodes 701, the channel 702 and the gate electrode 703 of the first transistor (7b) would respectively serve as the source/drain electrodes 111, the channel 112 and the gate electrode 113 of the first transistor 11 (see FIG. 23). The source/drain electrodes 701, the channel 702 and the gate electrode 703 of the second transistor (7a) would respectively serve as the source/drain electrodes 121, the channel 122 and the gate electrode 123 of the second transistor 12 (see FIG. 24).

Figure 27:
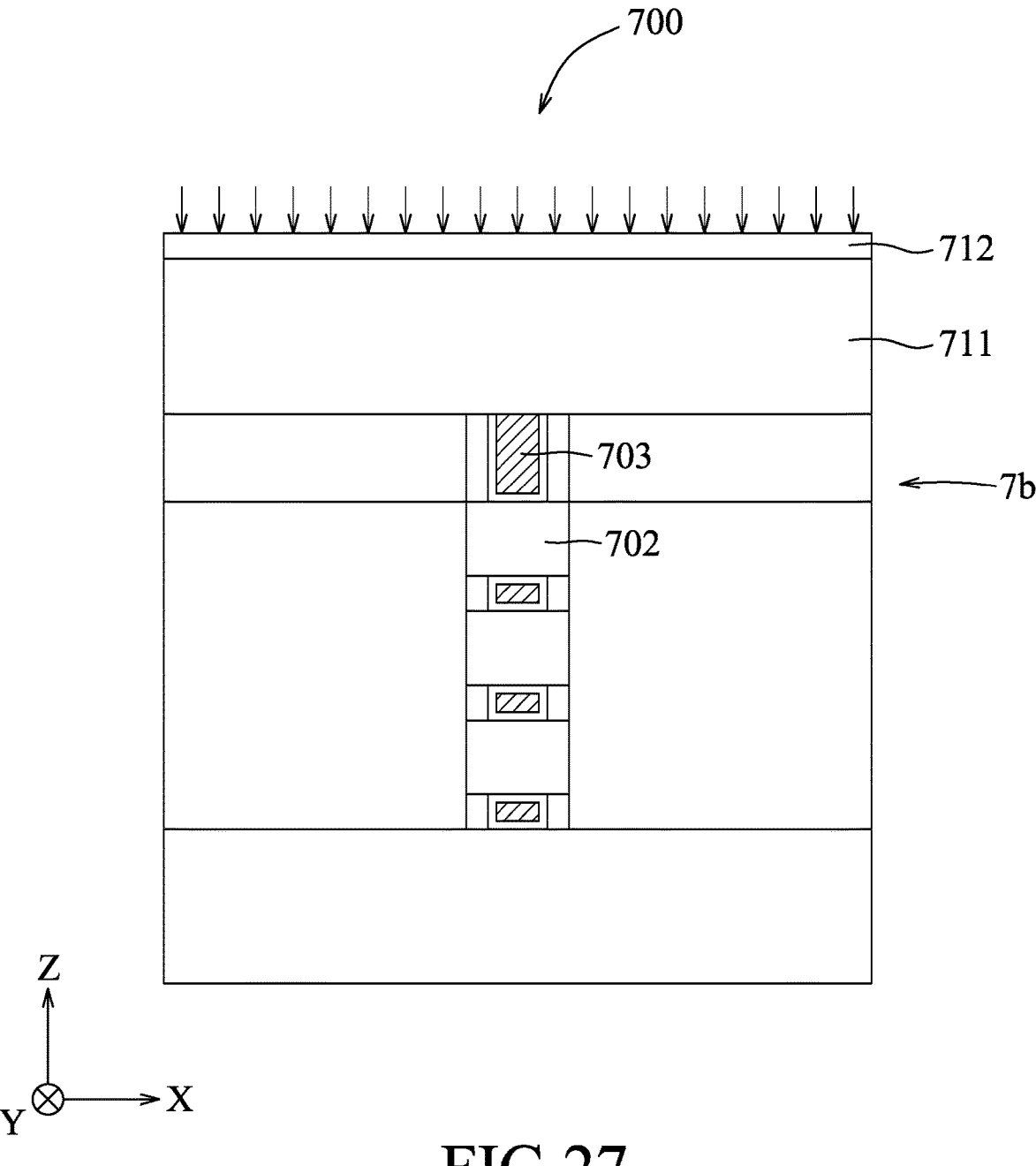
Figure 28:
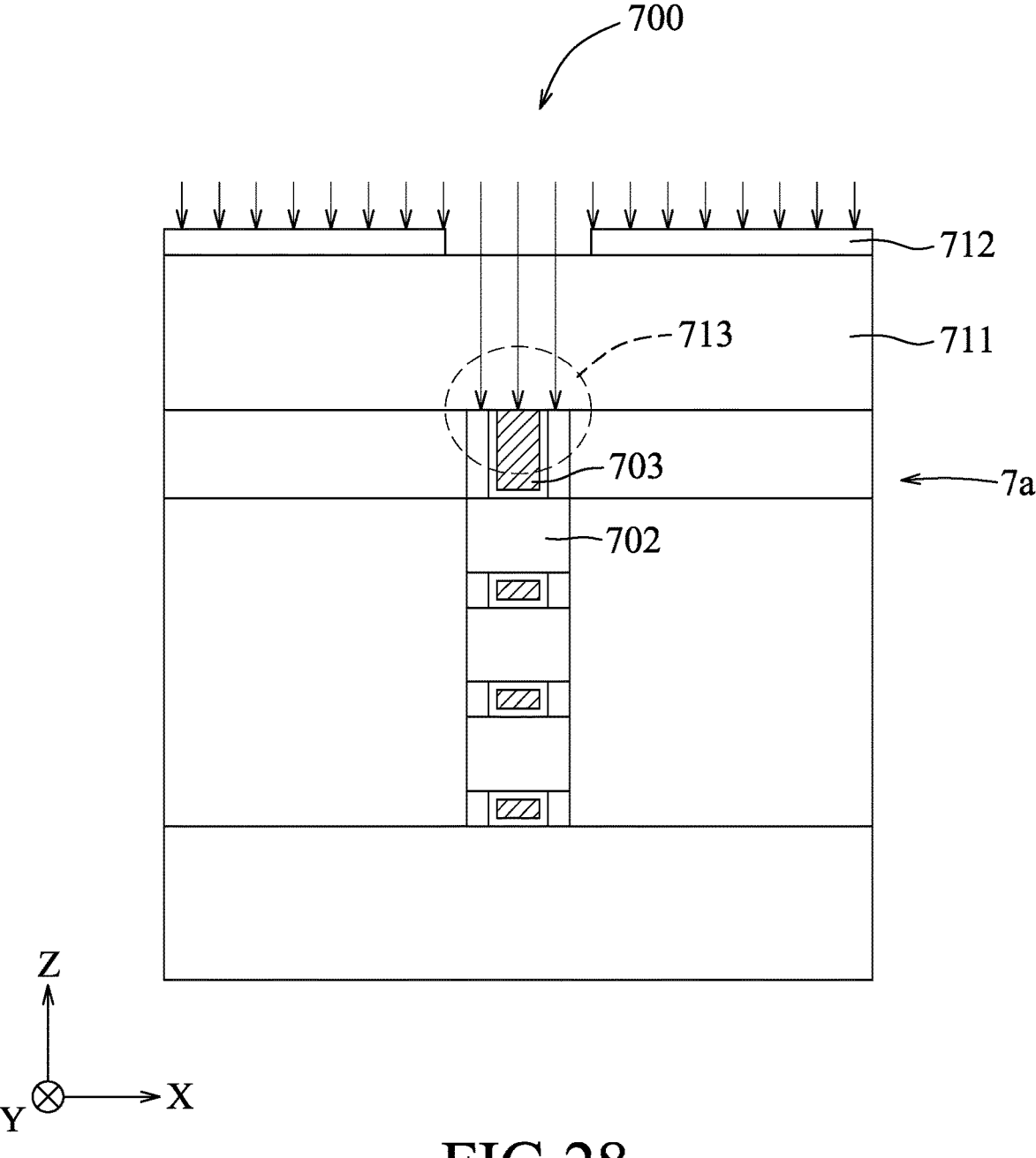

Referring to FIGS. 3, 27 and 28, the method 300 then proceeds to step 32, where a dielectric layer 711 is formed on the semiconductor structure 700 depicted in FIGS. 25 and 26, and then a portion of the gate electrode 703 of the second transistor (7a) is treated. The portion of the gate electrode 703 of the second transistor (7a) is at the top of the gate electrode 703 (i.e., being an upper portion of the gate electrode 703), and corresponds in position to the channel 702 of the second transistor (7a). In some embodiments, the dielectric layer 711 may be formed on the semiconductor structure 700 depicted in FIGS. 25 and 26 using, for example, CVD, PECVD, PVD, ALD, other suitable deposition techniques, or combinations thereof. In some embodiments, the dielectric layer 711 may include, for example, silicon oxide, silicon nitride, silicon oxynitride, other suitable materials, or combinations thereof. In some embodiments, the portion of the gate electrode 703 of the second transistor (7a) may be treated by: (a) coating a masking layer on the dielectric layer 711; (b) patterning the masking layer to form a patterned masking layer 712 that has an opening corresponding in position to the channel 702 of the second transistor (7a); and (c) performing, for example, implantation, bombardment, other suitable techniques, or combinations thereof on the semiconductor structure 700 as shown in FIGS. 27 and 28, so as to treat a region 713 of the semiconductor structure 700 that includes the portion of the gate electrode 703 of the second transistor (7a). The patterned masking layer 712 may be removed after the portion of the gate electrode 703 of the second transistor (7a) is treated. In some embodiments, the masking layer may be a photoresist or a hard mask. In some embodiments, the implantation may be performed using a material selected from, for example, nitride, boron, fluorine, other suitable materials, and combinations thereof, so the portion of the gate electrode 703 of the second transistor (7a) further includes the material. In some embodiments, the implantation may be performed at, for example, but not limited to, about room temperature. In some embodiments, energy and/or time of the implantation may be adjusted to change a position of the region 713 in a direction perpendicular to the semiconductor structure 700. In some embodiments, the bombardment may be performed using a material selected from, for example, oxygen, argon, krypton, helium, other suitable materials, and combinations thereof, so the portion of the gate electrode 703 of the second transistor (7a) further includes the material. In some embodiments, the bombardment may be performed at, for example, but not limited to, about room temperature. In some embodiments, energy and/or time of the bombardment may be adjusted to change the position of the region 713 in the direction perpendicular to the semiconductor structure 700. It should be noted that the region 713 has a substantially flat bottom surface when the opening of the patterned masking layer 712 is wide, and has a curved bottom surface when the opening of the patterned masking layer 712 is narrow.

Figure 29:
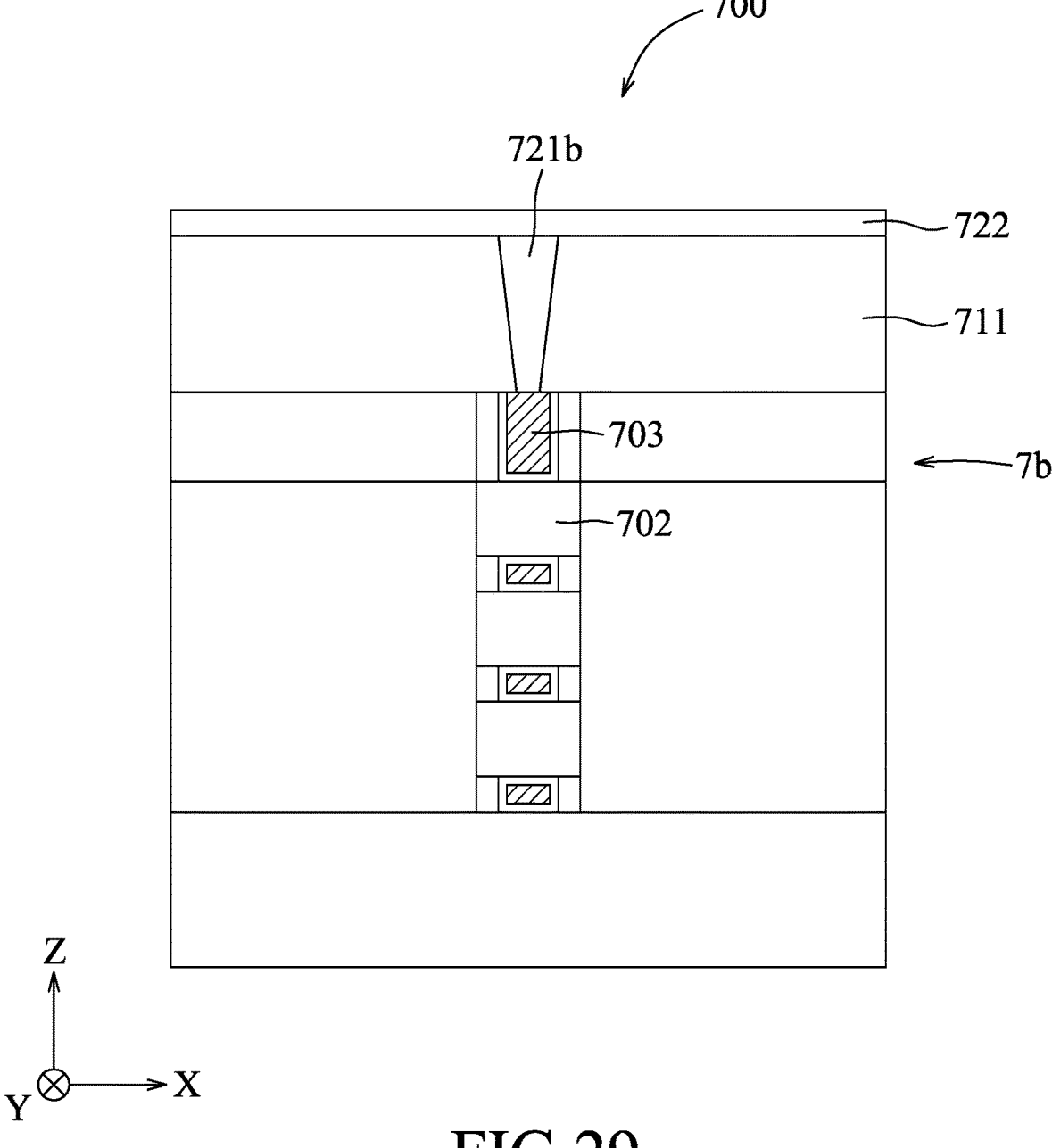
Figure 30:
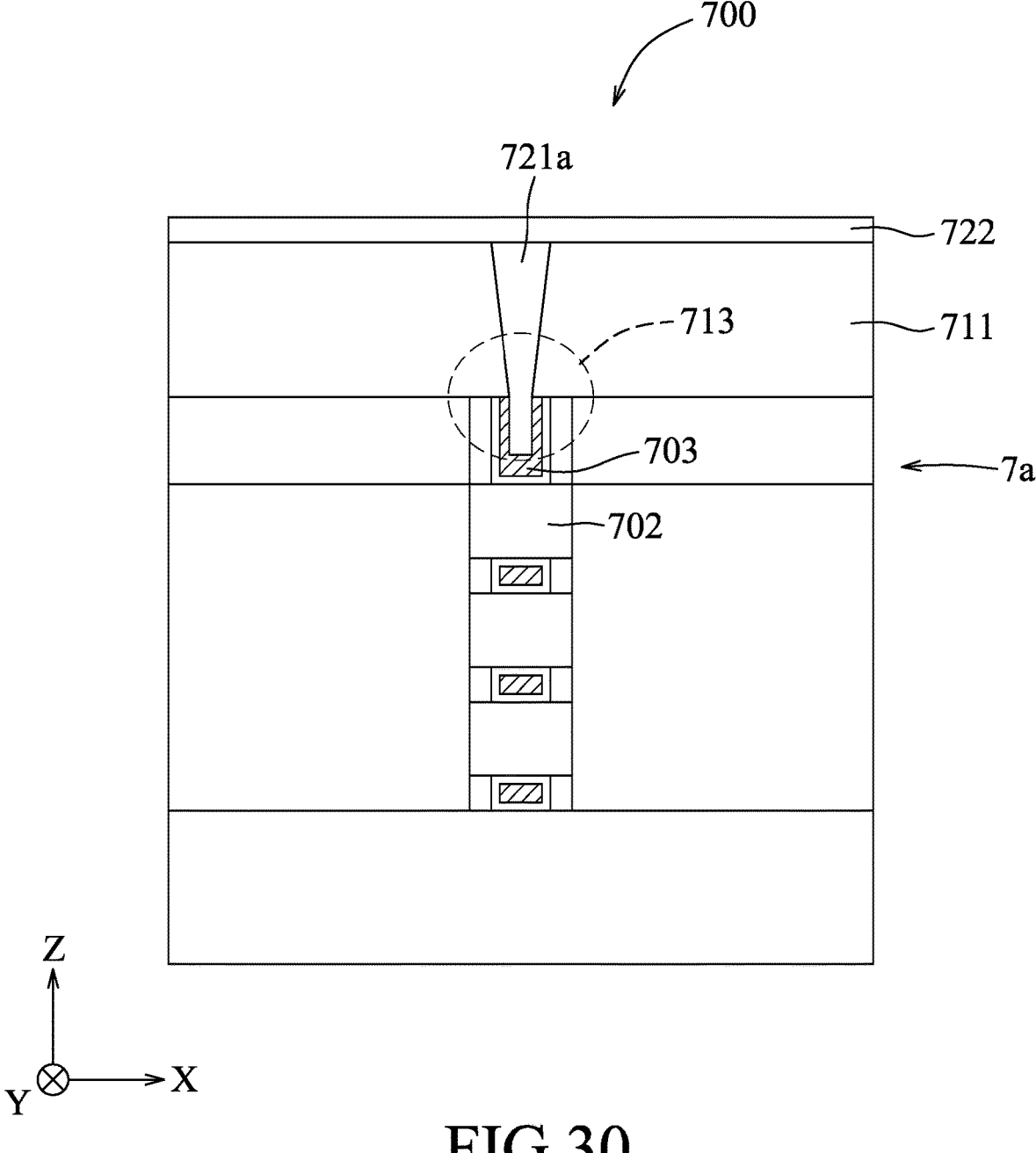

Referring to FIGS. 3, 29 and 30, the method 300 then proceeds to step 33, where a first via contact (721b) is formed in the dielectric layer 711, and a second via contact (721a) is formed in the dielectric layer 711 and the gate electrode 703 of the second transistor (7a). The first via contact (721b) corresponds in position to the channel 702 of the first transistor (7b), and would serve as the first via contact 13 (see FIG. 23). The second via contact (721a) corresponds in position to the channel 702 of the second transistor (7a), and would serve as the second via contact 14 (see FIG. 24). Moreover, in step 33, a conductive layer 722 is formed on the dielectric layer 711, the first via contact (721b) and the second via contact (721a). In some embodiments, the first via contact (721b) and the second via contact (721a) may be formed by: (a) patterning the semiconductor structure 700 depicted in FIGS. 27 and 28 using a photolithography process and an etching process similar to those used to pattern the substrate 900 (see FIG. 5) in sub-step 311 (see FIG. 4), so as to form a first recess that corresponds in position to the channel 702 of the first transistor (7b) and that exposes a top surface of the gate electrode 703 of the first transistor (7b), and a second recess that corresponds in position to the channel 702 of the second transistor (7a) and that extends into the treated portion of the gate electrode 703 of the second transistor (7a); (b) depositing a conductive material for forming the first via contact (721b) and the second via contact (721a) on the dielectric layer 711 and in the first recess and the second recess using, for example, CVD, PECVD, PVD, ALD, other suitable techniques, or combinations thereof; and (c) removing an excess of the conductive material using, for example, CMP, or other suitable planarization techniques, so as to expose a top surface of the dielectric layer 711, thereby forming the first via contact (721b) in the first recess and the second via contact (721a) in the second recess. It should be noted that the treated portion of the gate electrode 703 of the second transistor (7a) would be partially removed during the etching process, so the second recess can extend into the treated portion of the gate electrode 703 of the second transistor (7a). In some embodiments, the conductive material for forming the first via contact (721b) and the second via contact (721a) may include, for example, Cu, Co, Ru, Mo, Cr, W, Mn, Rh, Ir, Ni, Pd, Pt. Ag, Au, Al, or alloys thereof. In some embodiments, the conductive layer 722 may be formed using, for example, CVD, PECVD, PVD, ALD, other suitable deposition techniques, or combinations thereof. In some embodiments, the conductive layer 722 may include, for example, Cu, Co, Ru, Mo, Cr, W, Mn, Rh, Ir, Ni, Pd, Pt, Ag, Au, Al, or alloys thereof.

In accordance with some embodiments of the present disclosure, a semiconductor device includes a first transistor, a first via contact, a second transistor and a second via contact. The first transistor includes a channel and a gate electrode. The first via contact is disposed on the gate electrode of the first transistor, and corresponds in position to the channel of the first transistor. The second transistor includes a channel and a gate electrode. The second via contact is disposed on the gate electrode of the second transistor, and corresponds in position to the channel of the second transistor. A distance between the second via contact and the channel of the second transistor is smaller than a distance between the first via contact and the channel of the first transistor.

In accordance with some embodiments of the present disclosure, the distance between the second via contact and the channel of the second transistor is smaller than half the distance between the first via contact and the channel of the first transistor.

In accordance with some embodiments of the present disclosure, the gate electrode of the second transistor includes a material selected from nitride, boron, fluorine, and combinations thereof.

In accordance with some embodiments of the present disclosure, the gate electrode of the second transistor includes a material selected from oxygen, argon, krypton, helium, and combinations thereof.

In accordance with some embodiments of the present disclosure, a method for manufacturing a semiconductor device includes: forming a first transistor and a second transistor, each of which includes a channel and a gate electrode; forming a dielectric layer on the first transistor and the second transistor; treating an upper portion of the gate electrode of the second transistor; and forming a first via contact in the dielectric layer, and a second via contact in the dielectric layer and the gate electrode of the second transistor, the first via contact corresponding in position to the channel of the first transistor, the second via contact corresponding in position to the channel of the second transistor.

In accordance with some embodiments of the present disclosure, the upper portion of the gate electrode of the second transistor is treated by performing implantation.

In accordance with some embodiments of the present disclosure, the implantation is performed using a material selected from nitride, boron, fluorine, and combinations thereof.

In accordance with some embodiments of the present disclosure, the implantation is performed at room temperature.

In accordance with some embodiments of the present disclosure, the upper portion of the gate electrode of the second transistor is treated by performing bombardment.

In accordance with some embodiments of the present disclosure, the bombardment is performed using a material selected from oxygen, argon, krypton, helium, and combinations thereof.

11 12

In accordance with some embodiments of the present disclosure, the bombardment is performed at room temperature.

In accordance with some embodiments of the present disclosure, a distance between the second via contact and the channel of the second transistor is smaller than half a distance between the first via contact and the channel of the first transistor.

In accordance with some embodiments of the present disclosure, a method for manufacturing a semiconductor device includes: forming a transistor that includes a channel and a gate electrode; forming a dielectric layer on the transistor; treating an upper portion of the gate electrode; and forming a via contact in the dielectric layer and the gate electrode, the via contact corresponding in position to the channel.

In accordance with some embodiments of the present disclosure, the upper portion of the gate electrode is treated by performing implantation.

In accordance with some embodiments of the present disclosure, the implantation is performed using a material selected from nitride, boron, fluorine, and combinations thereof.

In accordance with some embodiments of the present disclosure, the implantation is performed at room temperature.

In accordance with some embodiments of the present disclosure, the upper portion of the gate electrode is treated by performing bombardment.

In accordance with some embodiments of the present disclosure, the bombardment is performed using a material selected from oxygen, argon, krypton, helium, and combinations thereof.

In accordance with some embodiments of the present disclosure, the implantation is performed at room temperature.

In accordance with some embodiments of the present disclosure, a distance between a bottom surface of the via contact and a top surface of the channel is smaller than half a distance between a top surface of the gate electrode and the top surface of the channel.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first transistor including a channel and a gate electrode;
a first via contact disposed on the gate electrode of the first transistor, and corresponding in position to the channel of the first transistor;
a second transistor substantially coplanar with the first transistor, and including a channel and a gate electrode; and
a second via contact disposed on the gate electrode of the second transistor, and corresponding in position to the channel of the second transistor;
wherein a distance between the second via contact and the channel of the second transistor is smaller than a distance between the first via contact and the channel of the first transistor.

2. The semiconductor device according to claim 1, wherein the distance between the second via contact and the channel of the second transistor is smaller than half the distance between the first via contact and the channel of the first transistor.

3. The semiconductor device according to claim 1, wherein the gate electrode of the second transistor includes a material selected from nitride, boron, fluorine, and combinations thereof.

4. The semiconductor device according to claim 1, wherein the gate electrode of the second transistor includes a material selected from oxygen, argon, krypton, helium, and combinations thereof.

5. A method for manufacturing a semiconductor device, comprising:
forming a first transistor and a second transistor, each of which includes a channel and a gate electrode;
forming a dielectric layer on the first transistor and the second transistor;
performing doping treatment on an upper portion of the gate electrode of the second transistor; and
forming a first via contact in the dielectric layer, and forming a second via contact in the dielectric layer and in the gate electrode of the second transistor, the first via contact corresponding in position to the channel of the first transistor, the second via contact corresponding in position to the channel of the second transistor.

6. The method according to claim 5, wherein the upper portion of the gate electrode of the second transistor is treated by performing implantation.

7. The method according to claim 6, wherein the implantation is performed using a material selected from nitride, boron, fluorine, and combinations thereof.

8. The method according to claim 6, wherein the implantation is performed at room temperature.

9. The method according to claim 5, wherein the upper portion of the gate electrode of the second transistor is treated by performing bombardment.

10. The method according to claim 9, wherein the bombardment is performed using a material selected from oxygen, argon, krypton, helium, and combinations thereof.

11. The method according to claim 9, wherein the bombardment is performed at room temperature.

12. The method according to claim 5, wherein a distance between the second via contact and the channel of the second transistor is smaller than half a distance between the first via contact and the channel of the first transistor.

13. A method for manufacturing a semiconductor device, comprising:
forming a transistor that includes a channel and a gate electrode;
forming a dielectric layer on the transistor;
performing doping treatment on an upper portion of the gate electrode; and
forming a via contact in the dielectric layer and in the gate electrode, the via contact corresponding in position to the channel.

14. The method according to claim 13, wherein the upper portion of the gate electrode is treated by performing implantation.

15. The method according to claim 14, wherein the implantation is performed using a material selected from nitride, boron, fluorine, and combinations thereof.

16. The method according to claim 14, wherein the implantation is performed at room temperature.

17. The method according to claim 13, wherein the upper portion of the gate electrode is treated by performing bombardment.

18. The method according to claim 17, wherein the bombardment is performed using a material selected from oxygen, argon, krypton, helium, and combinations thereof.

19. The method according to claim 17, wherein the implantation is performed at room temperature.

20. The method according to claim 13, wherein a distance between a bottom surface of the via contact and a top surface of the channel is smaller than half a distance between a top surface of the gate electrode and the top surface of the channel.

* * * * *